US006961433B2

(12) United States Patent
Ishii

(10) Patent No.: US 6,961,433 B2
(45) Date of Patent: Nov. 1, 2005

(54) STEREOPHONIC SOUND FIELD REPRODUCING APPARATUS

(75) Inventor: Toru Ishii, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 48 days.

(21) Appl. No.: 09/834,603

(22) Filed: Apr. 16, 2001

(65) Prior Publication Data

US 2001/0021257 A1 Sep. 13, 2001

Related U.S. Application Data

(63) Continuation of application No. PCT/JP99/05992, filed on Oct. 28, 1999.

(51) Int. Cl.[7] .......................... H04R 5/00; H04R 5/02; H03G 3/00

(52) U.S. Cl. .............................. 381/17; 381/1; 381/61; 381/309; 381/300

(58) Field of Search ............................ 381/17, 1, 300, 381/61, 309

(56) References Cited

U.S. PATENT DOCUMENTS

| | | | | | |
|---|---|---|---|---|---|
| 3,900,707 | A | * | 8/1975 | Hanson | 381/370 |
| 5,438,623 | A | * | 8/1995 | Begault | 381/17 |
| 5,495,534 | A | | 2/1996 | Inanaga et al. | |
| 5,666,425 | A | * | 9/1997 | Sibbald et al. | 381/26 |
| 5,742,689 | A | * | 4/1998 | Tucker et al. | 381/17 |
| 5,946,400 | A | * | 8/1999 | Matsuo | 381/17 |
| 6,259,795 | B1 | * | 7/2001 | McGrath | 381/310 |

FOREIGN PATENT DOCUMENTS

| | | | |
|---|---|---|---|
| EP | 0 705 053 | A2 | 4/1996 |
| JP | SHO 50-141301 | A | 11/1975 |
| JP | SHO 63-169790 | U | 11/1988 |
| JP | HEI 2-219400 | | 8/1990 |
| JP | HEI 3-128396 | U | 12/1991 |
| JP | 5-336599 | A | 12/1993 |
| JP | HEI 6-217400 | A | 8/1994 |
| JP | 6-261399 | A | 9/1994 |
| JP | HEI 10-145889 | A | 5/1998 |
| JP | HEI 11-275696 | A | 10/1999 |
| JP | 2000-354300 | A | 12/2000 |

* cited by examiner

*Primary Examiner*—Laura A. Grier
(74) *Attorney, Agent, or Firm*—Birch, Stewart, Kolasch & Birch, LLP

(57) ABSTRACT

In the stereophonic sound field reproducing apparatus for reproducing a stereophonic sound field, at the time of using, a signal processing unit (4) executes a process on signals to reproduction-use minispeakers (6L1 through 6LN, 6R1 through 6RN) so as to simultaneously correct characteristics between the reproduction-use minispeakers (6L1 through 6LN, 6R1 through 6RN) and a head of a user (5) and characteristics between the reproduction-use minispeakers (6L1 through 6LN, 6R1 through 6RN), and the reproduction-use minispeakers (6L1 through 6LN, 6R1 through 6RN) arranged around the head of the user (5) input signals and output sound waves.

9 Claims, 18 Drawing Sheets

STEREOPHONIC SOUND FIELD REPRODUCING APPARATUS

This application is a continuation of PCT/JP99/05992 filed Oct. 28, 1999.

TECHNICAL FIELD

This invention in general relates to a stereophonic sound field reproducing apparatus for reproducing a stereophonic sound field. More particularly, this invention relates to a stereophonic sound field reproducing apparatus for executing a signal process and reproducing a stereophonic sound field using a plurality of speakers.

BACKGROUND ART

Conventionally, as a stereophonic sound field reproducing apparatus, for example, the OSS (Ortho-Stereophonic System) which was suggested by Tomotoshi Miura (professor at the general research institute, Tokyo Denki University) is known. FIG. 18 is an explanatory diagram showing a structure of the conventional OSS. This OSS has a dummy head 51 called as HATS (Head and Torso Simulator) arranged in a stereophonic sound field 50 as recording target, a minimicrophone 52L arranged in a position of tympanic membrane of a left ear inside the HATS 51, a minimicrophone 52R arranged in a position of tympanic membrane of a right ear inside of the HATS 51. There is an OSS-Network section 60 for inputting signals from the minimicrophones 52L and 52R and executing a cross talk canceling process. A speaker 71L is provided in front-left of a listener (user) 72. A speaker 71R is provided in front-right of the user 72. The OSS reproduces the stereophonic sound field 70.

The OSS-Network section 60 has circuits 61L and 61R for correcting a free sound field front incident head transmission function of the user 72, a cross talk canceling circuit 62L for outputting a cross talk canceling signal to be added to a signal to the speaker 71R, a cross talk canceling circuit 62R for outputting a cross talk canceling signal to be added to a signal to the speaker 71L, a mixing circuit 63L for adding a cross talk canceling signal to a signal to the speaker 71L, a mixing circuit 63R for adding a cross talk canceling signal to a signal to the speaker 71R, a circuit 64L for correcting a characteristic between the speaker 71L and the user 72 according to an inverse function, and a circuit 64R for correcting a characteristic between the speaker 71R and the user 72 according to an inverse function.

How the conventional OSS works will be explained here. At first, the HATS 51 arranged in the stereophonic sound field 50 as recording target executes binaural recording. A sound, which was measured by the minimicrophone 52L arranged in the position of the tympanic membrane of the left ear in the HATS 51, and a sound, which was measured by the minimicrophone 52R arranged in the position of the tympanic membrane of the right ear in the HATS 51, are converted into signals L and R respectively. The signals L and R are input into the OSS-Network section 60.

The signals L and R input into the OSS-Network section 60 are corrected by the circuits 61L and 61R for correcting a free field front incident head transmission function of the user 72. These corrections are represented by:

$$EL=HEL/DEL$$

$$ER=HER/DER.$$

Here, EL is a transmission function of the circuit 61L, ER is a transmission function of the circuit 61R, HEL/DEL and HER/DER are correction terms of the free field front incident head transmission function.

Next, the cross talk canceling circuit 62L inputs an output signal of the circuit 61L and outputs a cross talk canceling signal to be added to a signal to the right speaker 71R. Similarly, the cross talk canceling circuit 62Rinputs an output signal of the circuit 61R and outputs a cross talk canceling signal to be added to a signal to the left speaker 71L. A transmission function CL of the cross talk canceling circuit 62L and a transmission function CR of the cross talk canceling circuit 62R are represented by:

$$CL=-HLO/HLS$$

$$CR=-HRO/HRS.$$

Here, HLO is a characteristic between the left speaker 71L and the right ear of the user 72, HLS is a characteristic between the left speaker 71L and the left ear of the user 72, HRO is a characteristic between the right speaker 71R and the left ear of the user 72, and HRS is a characteristic between the right speaker 71R and the right ear of the user 72.

Next, the mixing circuit 63L mixes the output signal of the circuit 61L with the cross talk canceling signal from the cross talk canceling circuit 62R so as to output the mixed signal to the circuit 64L. Similarly, the mixing circuit 63R mixes the output signal of the circuit 61R with the cross talk canceling signal from the cross talk canceling circuit 62L so as to output the mixed signal to the circuit 64R. The circuits 64L and 64R process the input signals according to the inverse functions for correcting the characteristics between the speakers 71L and 71R and the user so as to output the processed signals to the speakers 71L and 71R. A transmission function TL of the circuit 64L and a transmission function TR of the circuit 64R are represented as follows:

$$TL=1/((1-CL\times CR)HLS)$$

$$TR=1/((1-CL\times CR)HRS).$$

The signals processed in the OSS-Network section 60 are reproduced from the reproduction-use right and left speakers 71L and 71R, and the stereophonic sound field 70 is reproduced. HLS, HLO, HRS, HRO, HEL, HER, DEL and DER are previously measured, and characteristics (filter factors) of the respective circuits in the OSS-Network section 60 are determined.

However, in the conventional OSS, since a positional relationship between the head of the user and the speakers is not fixed, it is necessary to fix a position of the user. When the user moves his/her head, there arises a problem that the user feels that sound quality is incongruous or a phase is inverted.

DISCLOSURE OF THE INVENTION

It is an object of the present invention to provide a stereophonic sound field reproducing apparatus for generating a stereophonic sound without fixing a position of a user and without feeling that sound quality is incongruous and a phase is inverted.

The stereophonic sound field reproducing apparatus according to this invention comprises a plurality of sound wave output units, arranged around a head of a user at the time of using, which receive signals and output sound waves; and a first signal processing unit which processes signals to be supplied to the sound wave output units so as to simultaneously correct the signal based on the characteristics between the sound wave output units and the head of the user and the characteristics between the sound wave output units.

According to this invention, the sound wave output units are arranged around the head of the user at the time of using and input signals so as to output sound waves. Furthermore, the first signal processing unit processes signals to be supplied to the sound wave output units so as to simultaneously correct the signal based on the characteristics between the sound wave output units and the head of the user and the characteristics between the plurality of sound wave output units. As a result, even if a position or direction of the head of the user is changed, the positional relationship between the sound wave output units and the head of the user is not changed. Moreover, the characteristics between the sound wave output units and the head of the user and the characteristics between the sound wave output units are corrected simultaneously.

Furthermore, the stereophonic sound field reproducing apparatus further comprises a holding unit, attached to the head of the user at the time of using, which hold the sound wave output units around a circumference of the head of the user.

Thus, the holding unit is attached to the head of the user at the time of using and holds the sound wave output units to the circumference of the head of the user. As a result, the sound wave output units can be arranged easily around the head of the user.

In addition, in the stereophonic sound field reproducing apparatus, at least four sound wave output units are provided. These four sound wave output units are arranged in the vicinity of the ears of the user in such a manner that at least two sound wave output units are provided in the vicinity of each ear.

Thus, at least two sound wave output units are provided in the vicinity of each ear. Therefore, stereophonic sound field can be reproduced more properly.

In addition, the stereophonic sound field reproducing apparatus further comprises a plurality of detection units, arranged in positions or their vicinities where a relationship with a head of human body or a simulation units simulating human body is the same as a relationship between the head of the user and the sound wave output units at the time of recording, which detect a sound field and generate signals to be supplied to the sound wave output units.

Thus, the detection units are arranged in positions or their vicinities where a relationship with the head of human body or simulation units which imitates human body is the same as the relationship between the head of the user and the positions of the sound wave output units. The detection units detect a sound field and generate signals to be supplied to the sound wave output units. As a result, a sound field can be reproduced by using an actually measured value of a sound field around the head.

Furthermore, the stereophonic sound field reproducing apparatus further comprises a second signal processing unit which executes a process on the signals to be supplied to the sound wave output units using characteristics from a position where a sound image is fixed to vicinities of the sound wave output units.

Thus, the second signal processing unit executes the process on the signals to be supplied to the sound wave output units using the characteristics from a position where a sound image is fixed to the vicinities of the plurality of sound wave output units. For this reason, a desired sound image can be fixed in a desired position.

In addition, in the stereophonic sound field reproducing apparatus, at least eight sound wave output units are provided. These eight sound wave output units are arranged in the vicinity of the ears of the user in such a manner that at least four sound wave output units are provided in the vicinity of each ear. The four sound wave output units provided in the vicinity of each ear are provided in such a manner that they are positioned at apexes of a triangular pyramid.

Thus, at least four sound wave output units are provided in the vicinity of each ear and they are provided in such a manner that they are positioned at apexes of a triangular pyramid. As a result, a more stereophonic sound field is reproduced.

In addition, in the stereophonic sound field reproducing apparatus, the first signal processing unit corrects characteristics between all of the sound wave output units and the head of the user and characteristics between all of the sound wave output units simultaneously.

Thus, the first signal processing unit executes the signal process for correcting the characteristics between all the sound wave output units and the head of the user and the characteristics between all the sound wave output units simultaneously. As a result, a stereophonic image is reproduced more properly.

In addition, in the stereophonic sound field reproducing apparatus, out of the sound wave output units, a desired number of sound wave output units are provided in the vicinity of one ear of the user and the remaining sound wave output units are provided in the vicinity of the other ear. Furthermore, the first signal processing unit is divided into a third signal processing unit which corrects characteristics between all the sound wave output units corresponding to the one ear and the head of the user and characteristics between all the sound wave output units corresponding to the one ear, and a fourth signal processing unit which corrects characteristics between all the sound wave output units corresponding to the other ear and the head of the user and characteristics between all the sound wave output units corresponding to the other ear. Furthermore, the third and fourth signal processing units execute the signal process simultaneously.

Thus, the third signal processing unit executes the signal process for correcting the characteristics between all the sound wave output units corresponding to one ear and the head of the user and the characteristics between all the sound wave output units corresponding to one ear. Moreover, the fourth signal processing unit executes the signal process for correcting the characteristics between all the sound wave output units corresponding to the other ear and the head of the user and the characteristics between all the sound wave output units corresponding to the other ear. As a result, a calculation amount of the signal process is reduced.

BEST MODE FOR CARRYING OUT THE INVENTION

Preferred embodiments of this invention will be explained below with reference to the accompanying drawings.

Figure 1:
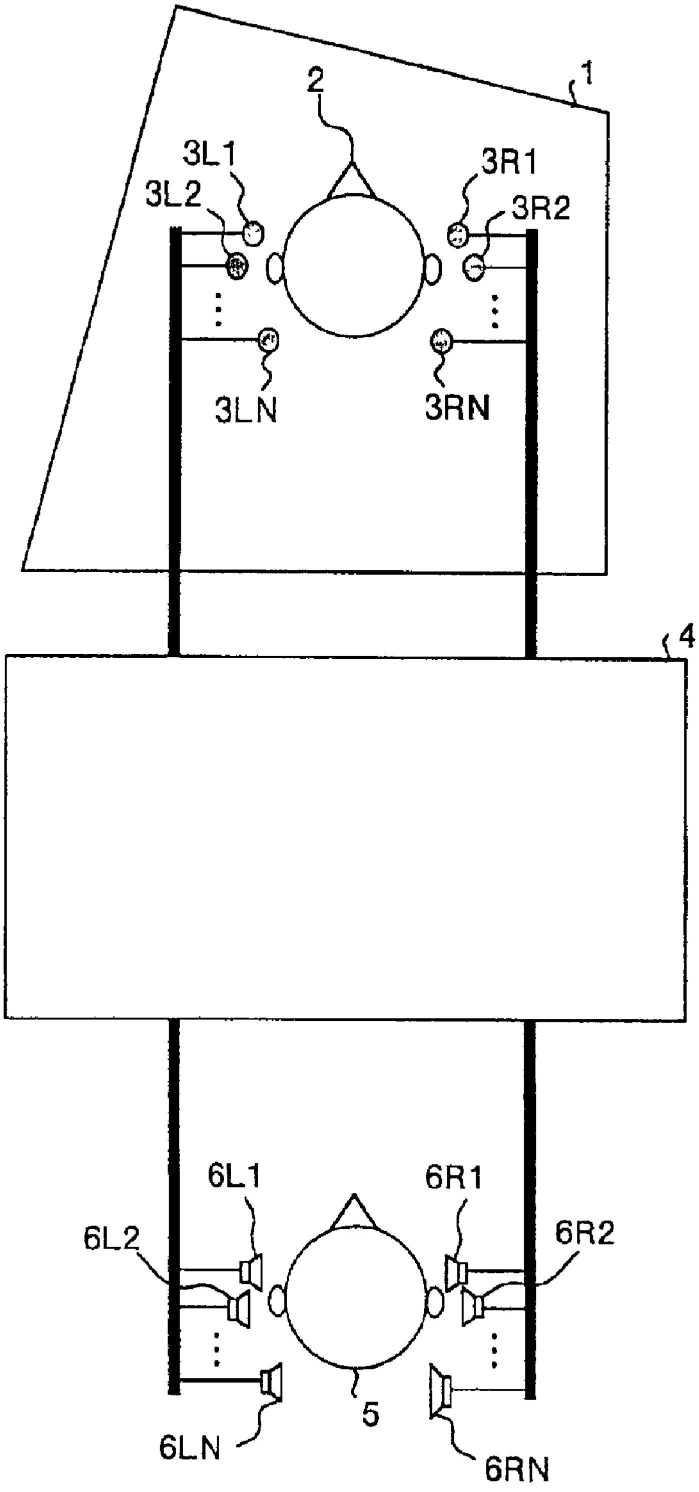
FIG. 1 is an explanatory diagram showing a structure of a stereophonic sound field reproducing apparatus according to one embodiment of the present invention.

To begin with, a structure of a stereophonic sound field reproducing apparatus according to one embodiment of the present invention will be explained. FIG. 1 is an explanatory diagram showing the structure of the stereophonic sound field reproducing apparatus according to the present embodiment. This stereophonic sound field reproducing apparatus has a dummy head 2 which is called as HATS (Head and Torso Simulator) arranged in a stereophonic sound field 1 as recording target, N-numbered minimicrophones 3L1 through 3LN (N: natural number) arranged in different positions in the vicinity of a left ear of the HATS 2 on the outside of the HATS 2, N-numbered minimicrophones 3R1 through 3RN arranged in different positions in the vicinity of a right ear of the HATS 2 on the outside of the HATS 2, a signal processing unit 4 having a plurality of signal processing circuits (filters), N-numbered reproduction-use minispeakers 6L1 through 6LN arranged in different positions in the vicinity of the left ear of a user 5, and N-numbered reproduction-use minispeakers 6R1 through 6RN arranged in different positions in the vicinity of a right ear of the user 5.

In the stereophonic sound field 1 as recording target including reflection and diffraction of the HATS 2, the minimicrophones 3L1 through 3LN and 3R1 through 3RN detect sound pressures in the respective arranged positions, and generate sound pressure data. The generated sound pressure data are recorded in a recorder, not shown, with multi-channel. The multi-channel signals (sound pressure data) recorded in the recorder, not shown, are input into the signal processing unit 4 individually.

The signal processing unit 4 processes the input 2N-numbered multi-channel signals. The signal processing unit 4 stores characteristics between the head of the user 5 and the plurality of reproduction-use minispeakers 6L1 through 6LN and 6R1 through 6RN which were previously measured, particularly characteristics between the vicinities of the ears of the user 5 and the plurality of reproduction-use minispeakers 6L1 through 6LN and 6R1 through 6RN, and characteristics between the plurality of reproduction-use minispeakers 6L1 through 6LN and 6R1 through 6RN. The signal processing unit 4 processes the signals so as to correct these characteristics and outputs 2N-numbered multi-channel signals.

The reproduction-use minispeakers 6Ll through 6LN and 6R1 through 6RN arranged in the vicinities of both the ears of the user 5 input the 2N-numbered channel signals from the signal processing unit 4, and output sound waves. Here, the reproduction-use minispeakers 6L1 through 6LN and 6R1 through 6RN are arranged in positions or their vicinities where a relationship with the head of the user 5 becomes the same as the relationship between the position of the head of the HATS 2 and the positions of the minimicrophones 3L1 through 3LN and 3R1 through 3RN when they are used. In other words, the minimicrophones 3L1 through 3LN and 3R1 through 3RN are arranged in the positions which are relatively the same as the positions of the reproduction-use minispeakers 6L1 through 6LN and 6R1 through 6RN.

In such a manner, in order to perform the signal process for correcting the characteristics between the vicinities of both the ears of the user 5 and the plurality of reproduction-use minispeakers 6L1 through 6LN and 6R1 through 6RN and correcting the characteristics between the plurality of reproduction-use minispeakers 6L1 through 6LN and 6R1 through 6RN simultaneously, the sound pressures recorded by the minimicrophones 3L1 through 3LN and 3R1 through 3RN are reproduced properly in the positions around the head of the user 5 corresponding to the respective recording positions so that the stereophonic sound field 1 as recording target can be reproduced properly in the vicinity of both the ears of the user 5. Moreover, since the reproduction-use minispeakers 6L1 through 6LN and 6R1 through 6RN are arranged in the vicinities of the head of the user 5, stereophonic sound whose sense of direction and sense of distance are correct can be generated without fixing the position of the user 5 and without feeling that sound quality is incongruous and phase is inverted. Here, instead of the HATS 2, a measurement by means of the actual human body may be made.

Figure 2:
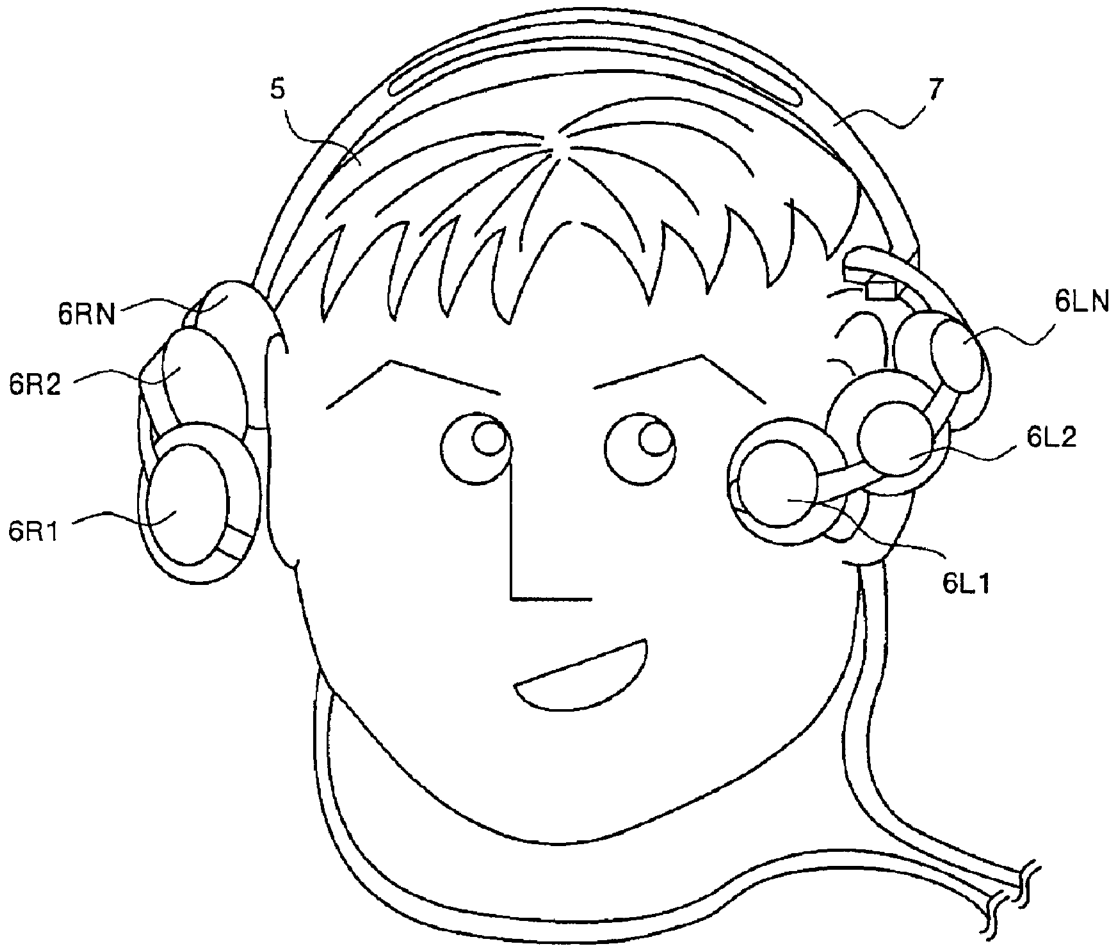
FIG. 2 is a perspective view showing a structure of a speaker section according to the present embodiment.

FIG. 2 is a perspective view showing a structure of a speaker portion of the stereophonic sound field reproducing apparatus according to the present embodiment. This speaker portion has the reproduction-use minispeakers 6L1 through 6LN and 6R1 through 6RN, and a holding section 7 for holding the reproduction-use minispeakers 6L1 through 6LN and 6R1 through 6RN onto the head of the user 5. The holding section 7 can easily arrange the reproduction-use minispeakers 6L1 through 6LN and 6R1 through 6RN in predetermined positions around the head of the user 5. Even when the head of the user 5 is moved, the positional relationship between the reproduction-use minispeakers 6L1 through 6LN and 6R1 through 6RN and the head of the user 5 is maintained. This speaker section is of a headphone shape, and is attached to the head of the user 5 at the time of using, but it does not shut the ears of the user 5. For this reason, a natural sound field with a feeling of freedom can be reproduced.

Figure 3:
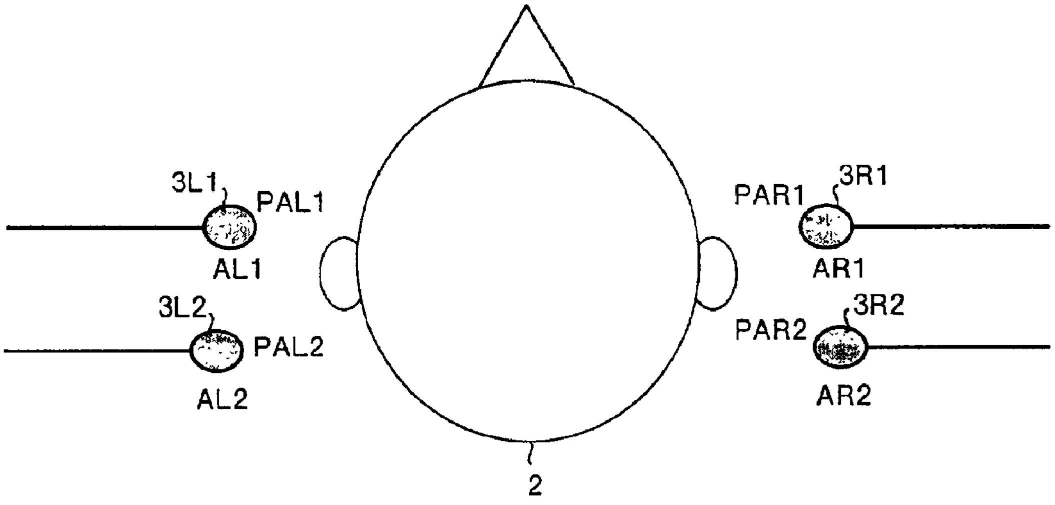
FIG. 3 is an explanatory diagram showing one example of an arrangement of minimicrophones according to the present embodiment.
Figure 4:
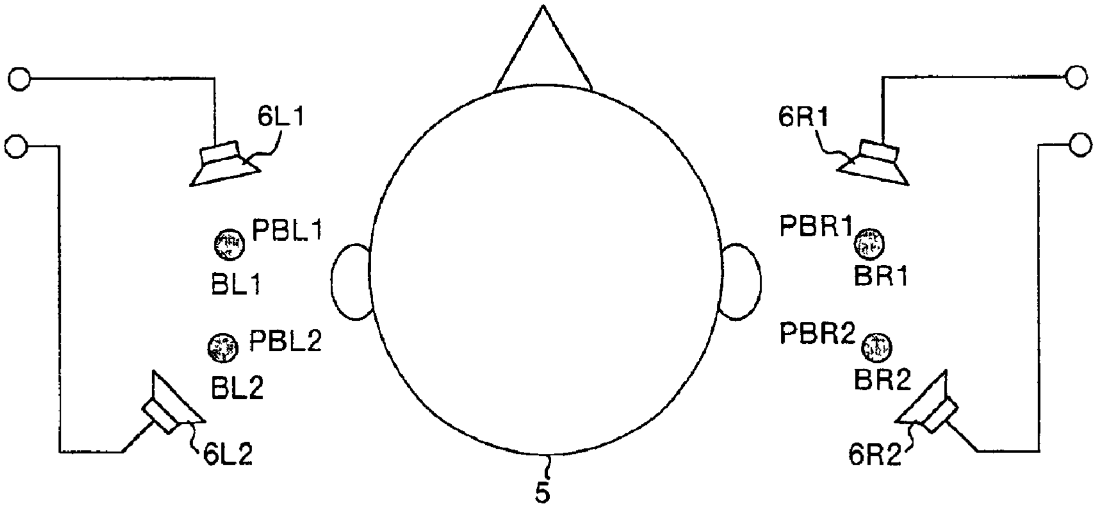
FIG. 4 is an explanatory diagram showing one example of an arrangement of reproduction-use minispeakers according to the present embodiment.

FIG. 3 is an explanatory diagram showing one example of the arrangement of the minimicrophones according to the present embodiment. FIG. 4 is an explanatory diagram showing one example of the arrangement of the reproduction-use minispeakers according to the present embodiment. For example, the minimicrophones 3L1 and 3L2 are provided in positions AL1 and AL2 in the vicinity of the left ear of the HATS 2, and the minimicrophones 3R1 and 3R2 are provided in positions AR1 and AR2 in the vicinity of the right ear of the HATS 2. One minimicrophone may be provided in each vicinity of both the ears of the HATS 2, or the provision is not limited to the vicinity of the ears and may be provided in arbitrary positions around the head of the HATS 2. However, the plurality of minimicrophones are arranged in the vicinities of both the ears so that a sound field can be expected to be reproduced with reality. The minimicrophones 3L1, 3L2, 3R1 and 3R2 measure (detect) the sound pressures PAL1, PAL2, PAR1 andPAR2 in the positions AL1, AL2, AR1 and AR2 respectively. In the relatively same positions around the head of the user 5, these sound pressures are reproduced properly so that the sound field can be reproduced properly.

In addition, the reproduction-use minispeakers 6L1 and 6L2 are provided so as to be located in the vicinities of positions BL1 and BL2 in the vicinity of the left ear of the user 5. The reproduction-use minispeakers 6R1 and 6R2 are provided so as to be located in the vicinities of positions BR1 and BR2 in the vicinity of the right ear of the user 5. Here, the positions BL1, BL2, BR1 and BR2 are the relatively same as the positions AL1, AL2, AR1 and AR2. Namely, the positional relationship between the head of the HATS 2 and the positions AL1, AL2, AR1, AR2 is the same as the positional relationship between the head of the user 5 and the positions BL1, BL2, BR1 and BR2.

With these plurality of reproduction-use minispeakers 6L1, 6L2, 6R1 and 6R2, a sound pressure PBL1 is generated in the position BL1, a sound pressure PBL2 is generated in the position BL2, a sound pressure PBR1 is generated in the position BR1, and a sound pressure PBR2 is generated in the position BR2. When the sound pressures PBL1, PBL2, PBR1 and PBR2 are equal to the sound pressures PAL1, PAL2, PAR1 and PAR2, a stereophonic sound with correct sense of direction and sense of distance can be generated.

Figure 5:
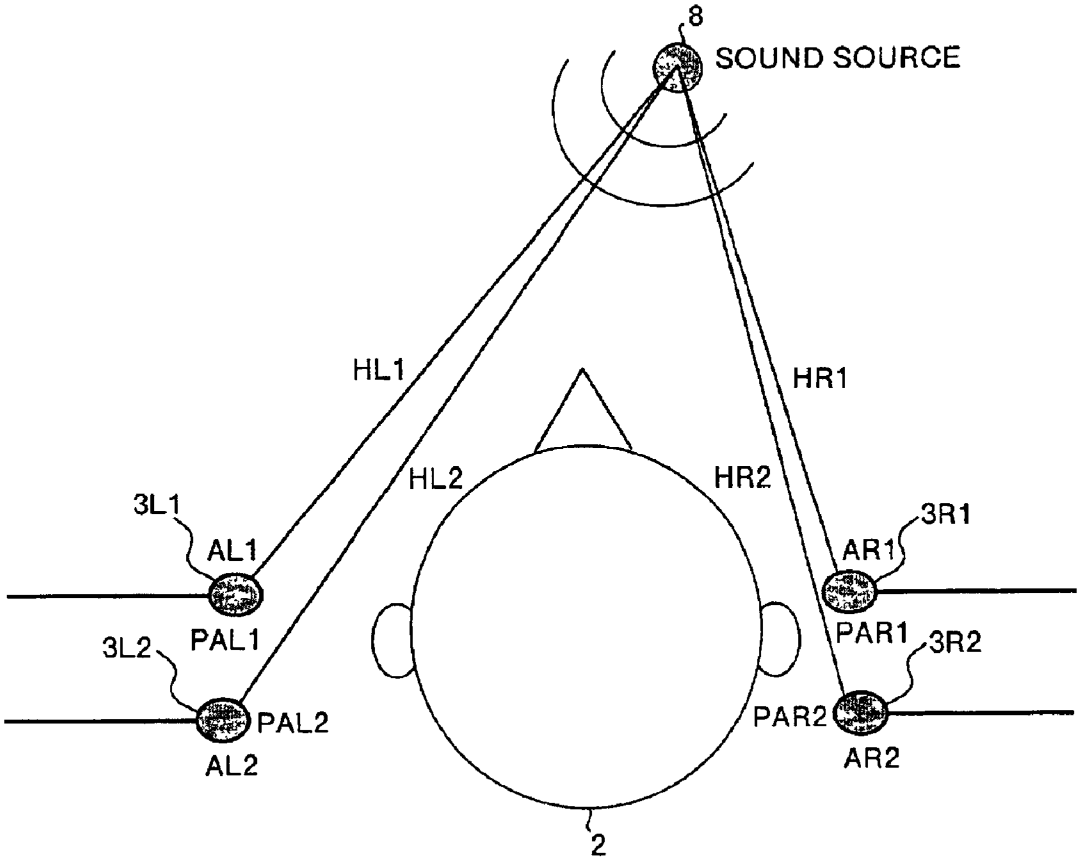
FIG. 5 is an explanatory diagram for explaining a recording process according to the present embodiment.

FIG. 5 is an explanatory diagram for explaining a recording process of the stereophonic sound field generating apparatus according to the present invention. In this recording process, a signal (sound wave) propagated from a sound source 8 for creating a sound field as recording target is measured (detected) in the positions AL1, AL2, AR1 and AR2 in the vicinities of both the ears of the HATS 2. In general, a characteristic of a propagation path of sound wave from sound source to head in a sound space can be represented by a head transmission function. A head transmission function from the sound source 8 to the position AL1 is HL1, a head transmission function from the sound source 8 to the position AL2 is HL2, a head transmission function from the sound source 8 to the position AR1 is HR1, and a head transmission function from the sound source 8 to the position AR2 is HR2. A sound wave from the sound source 8 is processed by the head transmission HL1 and measured by the minimicrophone 3L1, processed by the head transmission function HL2 and measured by the minimicrophone 3L2, processed by the head transmission function HR1 and measured by the minimicrophone 3R1, and processed by the head transmission function HR2 and measured by the minimicrophone 3R2.

In such a manner, the sound pressures PAL1, PAL2, PAR1 and PAR2 measured in the positions AL1, AL2, AR1 and AR2 are subject to the processes using the head transmission functions HL1, HL2, HR1 and HR2, and the measured sound pressures PAL1, PAL2, PAR1 and PAR2 are reproduced properly in the positions BL1, BL2, BR1 and BR2. As a result, direction and distance of the sound source can be represented. Namely, a sound image can be fixed in the position where the positional relationship with the user 5 is the same as the positional relationship between the HATS2 and the sound source 8.

Figure 6:
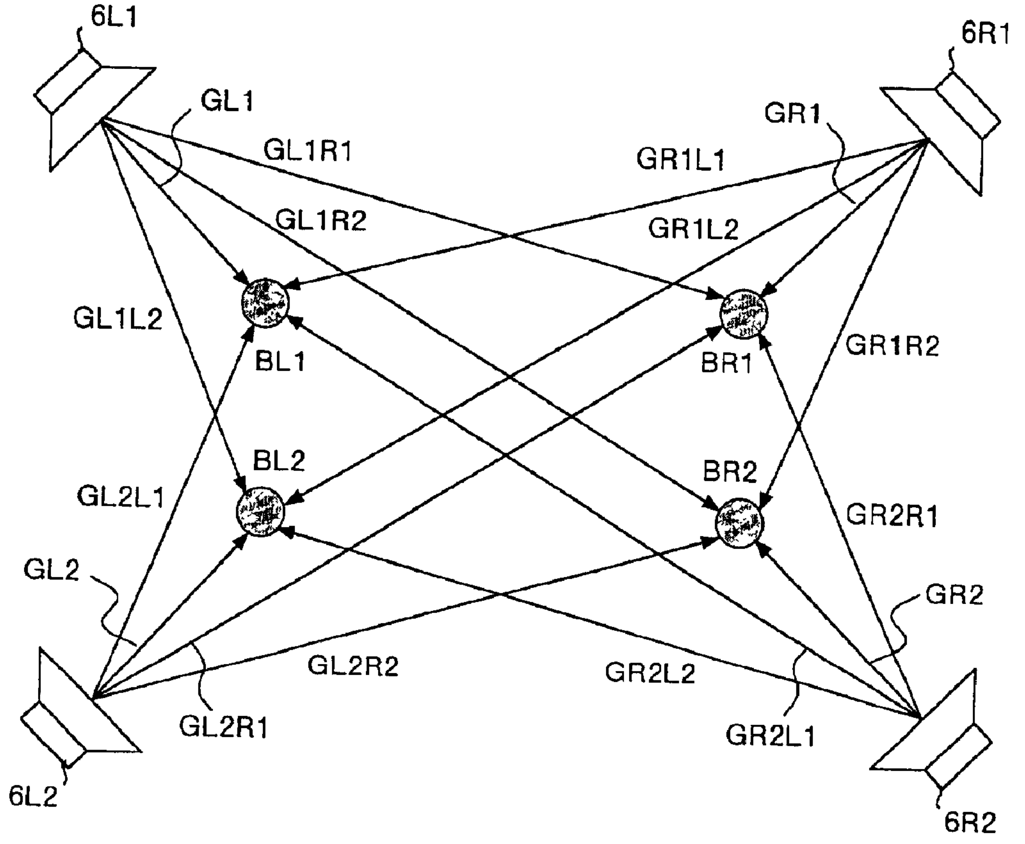
FIG. 6 is an explanatory diagram for explaining a reproducing process according to the present embodiment.

FIG. 6 is an explanatory diagram for explaining a reproducing process of the stereophonic sound field generating apparatus according to the present embodiment. In this reproducing process, the reproduction-use minispeakers 6L1, 6L2, 6R1 and 6R2 input the signals processed in the signal processing unit 4, and output sound waves. These sound waves propagate to the positions BL1, BL2, BR1 and BR2 so that the sound pressures PBL1, PBL2, PBR1 and PBR2 are generated.

The sound wave output from the reproduction-use minispeaker 6L1 is processed by a transmission function GL1 including reflection of person or HATS2 from the reproduction-use minispeaker 6L1 to the position BL1 so as to be propagated to the position BL1, processed by a transmission function GL1L2 including reflection of person or HATS2 from the reproduction-use minispeaker 6L1 to the position BL2 so as to be propagated to the position BL2, processed by a transmission function GL1R1 including reflection of person or HATS2 from the reproduction-use minispeaker 6L1 to the position BR1 so as to be propagated to the position BR1, and processed by a transmission function GL1R2 including reflection of person or HATS2 from the reproduction-use minispeaker 6L1 to the position BR2 so as to be propagated to the position BR2.

Similarly, the sound wave output from the reproduction-use minispeaker 6L2 is processed by a transmission function GL2L1 including reflection of person or HATS2 from the reproduction-use minispeaker 6L2 to the position BL1 so as to be propagated to the position BL1, processed by a transmission function GL2 including reflection of person or HATS2 from the reproduction-use minispeaker 6L2 to the position BL2 so as to be propagated to the position BL2, processed by a transmission function GL2Rl including reflection of person or HATS2 from the reproduction-use minispeaker 6L2 to the position BR1 so as to be propagated to the position BR1, and processed by a transmission function GL2R2 including reflection of person or HATS2 from the reproduction-use minispeaker 6L2 to the position BR2 so as to be propagated to the position BR2.

In addition, the sound wave output from the reproduction-use minispeaker 6R1 is processed by a transmission function Gr1L1 including reflection of person or HATS2 from the reproduction-use minispeaker 6R1 to the position BL1 so as to be propagated to the position BL1, processed by a transmission function GR1L2 including reflection of person or HATS2 from the reproduction-use minispeaker 6R1 to the position BL2 so as to be propagated to the position BL2, processed by a transmission function GR1 including reflection of person or HATS2 from the reproduction-use minispeaker 6R1 to the position BR1 so as to be propagated to the position BR1, and processed by a transmission function GR1R2 including reflection of person or HATS2 from the reproduction-use minispeaker 6R1 to the position BR2 so as to be propagated to the position BR2.

In addition, the sound wave output from the reproduction-use minispeaker 6R2 is processed by a transmission function GR2L1 including reflection of person or HATS2 from the reproduction-use minispeaker 6R2 to the position BL1 so as to be propagated to the position BL1, processed by a transmission function GR2L2 including reflection of person or HATS2 from the reproduction-use minispeaker 6R2 to the position BL2 so as to be propagated to the position BL2, processed by a transmission function GR2R1 including reflection of person or HATS2 from the reproduction-use minispeaker 6R2 to the position BR1 so as to be propagated to the position BR1, and processed by a transmission function GR2 including reflection of person or HATS2 from the reproduction-use minispeaker 6R2 to the position BR2 so as to be propagated to the position BR2.

In such a manner, the sound pressures PBL1, PBL2, PBR1 and PBR2 in the positions BL1, BL2, BR1 and BR2 are generated by the sound waves propagated from the four reproduction-use minispeakers 6L1, 6L2, 6R1 and 6R2 at the time of reproduction. Namely, these sound pressures are composed of four components. In the case where the synthesized results of the four components are equal to the sound pressures PAL1, PAL2, PAR1 and PAR2 as recorded results, this means that the head transmission functions HL1, HL2, HR1 and HR2 are processed correctly in the positions BL1, BL2, BR1 and BR2. As a result, the stereophonic sound field, in which a sense of direction and a sense of distance are proper, namely, a position of the sound source is sensed properly, is reproduced.

The signals, which are processed by the transmission functions GL1L2, GL1R1, GL1R2, GL2L1, GL2R1, GL2R2, GR1L1, GR1L2, GR1R2, GR2L1, GR2L2 and GR2R1 so as to be propagated in the signals (sound waves) propagated from the four reproduction-use minispeakers 6L1, 6L2, 6R1 and 6R2 to the positions BL1, BL2, BR1 and BR2, are called as cross talk components, and they should be canceled. Meanwhile, the signals which are processed by the transmission functions GL1, GL2, GR1 and GR2 to be propagated are called as direct components, and they are used for reproducing the stereophonic sound field.

Figure 7:
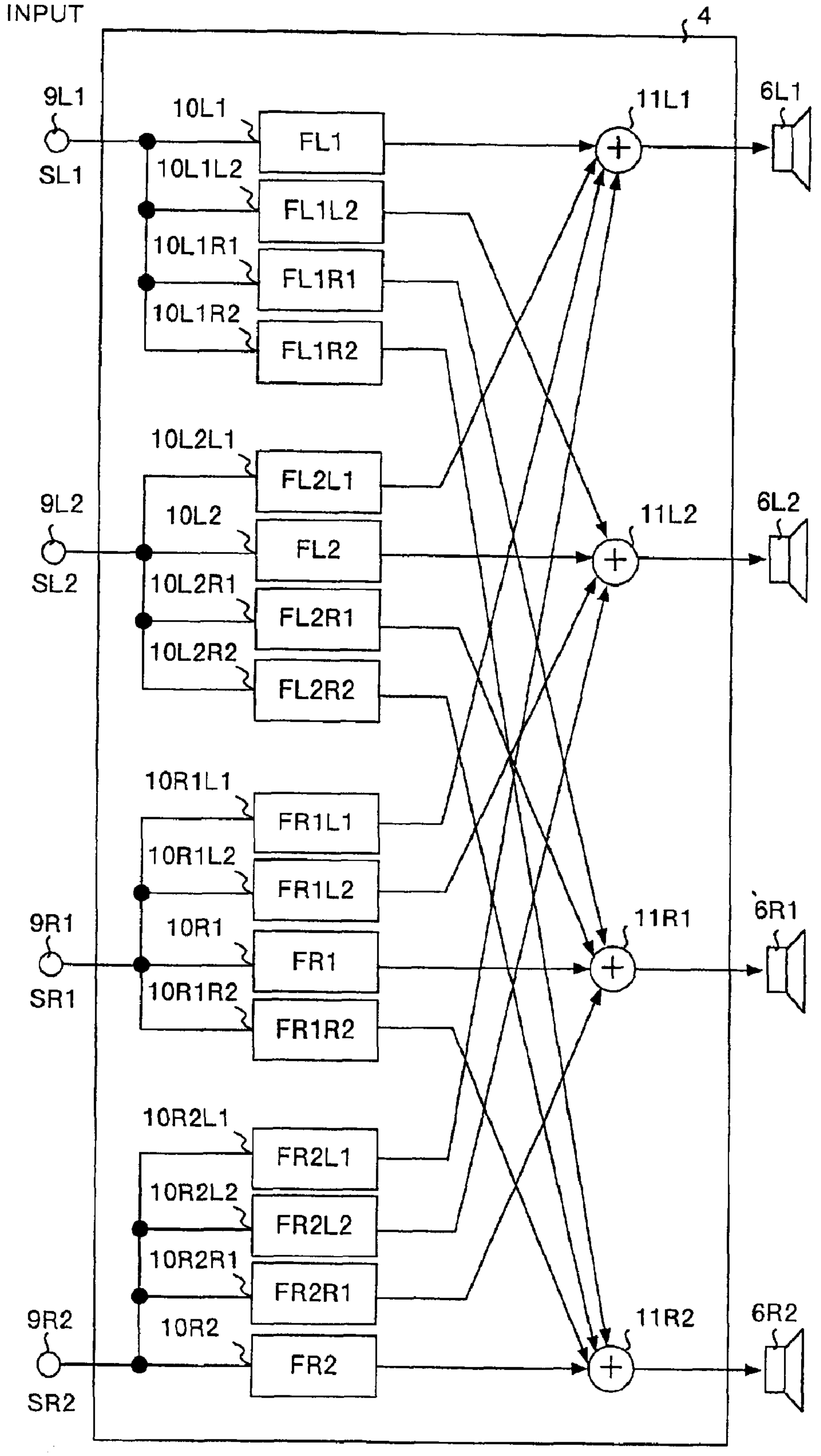
FIG. 7 is a block diagram showing one example of a structure of a signal processing unit according to the present embodiment shown in FIG. 1.

FIG. 7 is a block diagram showing one example of the structure of the signal processing unit 4 according to the present embodiment shown in FIG. 1. The signal processing unit 4 has an input terminal 9L1, an input terminal 9L2, an input terminal 9R1, an input terminal 9R2, a circuit (filter) 10L1, a circuit (filter) 10L2, a circuit (filter) 10R1, a circuit (filter) 10R2, cross talk cancellers 10L1L2, 10L1R1, 10L1R2, 10L2L1, 10L2R1, 10L2R2, 10R1L1, 10R1L2, 10R1R2, 10R2L1, 10R2L2 and 10R2R1, an adder 11L1, an adder 11L2, an adder 11R1 and an adder 11R2. The input terminal 9L1 inputs a signal SL1 measured by the minimicrophone 3L1. The input terminal 9L2 inputs a signal SL2 measured by the minimicrophone 3L2. The input terminal 9R1 inputs a signal SR1 measured by the minimicrophone 3R1. The input terminal 9R2 inputs a signal SR2 measured by the minimicrophone 3R2. The circuit 10L1 corrects a characteristic of the minimicrophone 3L1, a characteristic of the reproduction-use minispeaker 6L1 and a characteristic including the transmission function GL1 using an inverse function. The circuit 10L2 corrects a characteristic of the minimicrophone 3L2, a characteristic of the reproduction-use minispeaker 6L2 and a characteristic including the transmission function GL2 using an inverse function. The circuit 10R1 corrects a characteristic of the minimicrophone 3R1, a characteristic of the reproduction-use minispeaker 6R1 and a characteristic including the transmission function GR1 using an inverse function. The circuit 10R2 corrects a characteristic of the minimicrophone 3R2, a characteristic of the reproduction-use minispeaker 6R2 and a characteristic including the transmission function GR2 using an inverse function. The cross talk cancellers 10L1L2, 10L1R1, 10L1R2, 10L2L1, 10L2R1, 10L2R2, 10R1L1, 10R1L2, 10R1R2, 10R2L1, 10R2L2 and 10R2R1 generate cross talk canceling signals for canceling the signals which are processed by the transmission functions GL1L2, GL1R1, GL1R2, GL2L1, GL2R1, GL2R2, GR1L1, GR1L2, GR1R2, GR2L1, GR2L2 and GR2R1 so as to be propagated. The adder 11L1 adds the output signal of the circuit 10L1 and the cross talk canceling signals from the cross talk cancellers 10L2L1, 10R1L1 and 10R2L1. The adder 11L2 adds the output signal of the circuit 10L2 and the cross talk canceling signals from the cross talk cancellers 10L1L2, 10R1L2 and 10R2L2. The adder 11R1 adds the output signal of the circuit 10R1 and the cross talk canceling signals from the cross talk cancellers 10L1R1, 10L2R1 and 10R2R1. The adder 11R2 adds the output signal of the circuit 10R2 and the cross talk canceling signals from the cross talk cancellers 10L1R2, 10L2R2 and 10R1R2.

The circuits 10L1, 10L2, 10R1 and 10R2 and the cross talk cancellers 10L1L2, 10L1R1, 10L1R2, 10L2L1, 10L2R1, 10L2R2, 10R1L1, 10R1L2, 10R1R2, 10R2L1, 10R2L2 and 10R2R1 may be realized by, for example, using a general-purpose microprocessor, or DSP (Digital Signal Processor) for higher speed.

Transmission functions FL1, FL2, FR1 and FR2 of the circuits 10L1, 10L2, 10R1 and 10R2, and transmission functions FL1L2, FL1R1, FL1R2, FL2L1, FL2R1, FL2R2, FR1L1, FR1L2, FR1R2, FR2L1, FR2L2 and FR2R1 of the cross talk cancellers 10L1L2, 10L1R1, 10L1R2, 10L2L1, 10L2R1, 10L2R2, 10R1L1, 10R1L2, 10R1R2, 1OR2L1, 10R2L2 and 10R2R1 are calculated based on the transmission functions GL1, GL2, GR1, GR2, GL1L2, GL1R1, GL1R2, GL2L1, GL2R1, GL2R2, GR1L1, GR1L2, GR1R2, GR2L1, GR2L2 and GR2R1, the characteristics of the minispeakers 6L1, 6L2, 6R1 and 6R2, the characteristics of the minispeakers 6L1, 6L2, 6R1 and 6R2 and the like.

The transmission functions GL1, GL2, GR1, GR2, GL1L2, GL1R1, GL1R2, GL2L1, GL2R1, GL2R2, GR1L1, GR1L2, GR1R2, GR2L1, GR2L2 and GR2R1, the characteristics of the minispeakers 6L1, 6L2, 6R1 and 6R2, and the characteristics of the minimicrophones 3L1, 3L2, 3R1 and 3R2 are calculated in the following manner. For example, in the environment shown in FIG. 6, the head of a person or HATS2 is arranged in the position similar to that at the time of reproduction, the minimicrophones 3L1, 3L2, 3R1 and 3R2 are arranged in the positions BL1, BL2, BR1 and BR2, white noise and impulse are generated from the minispeakers 6L1, 6L2, 6R1 and 6R2 successively one by one, the sound pressures PBL1, PBL2, PBR1 and PBR2 are measured, and the above transmission functions and the characteristics are calculated from the characteristics of the measured sound pressures PBL1, PBL2, PBR1 and PBR2.

Figure 8:
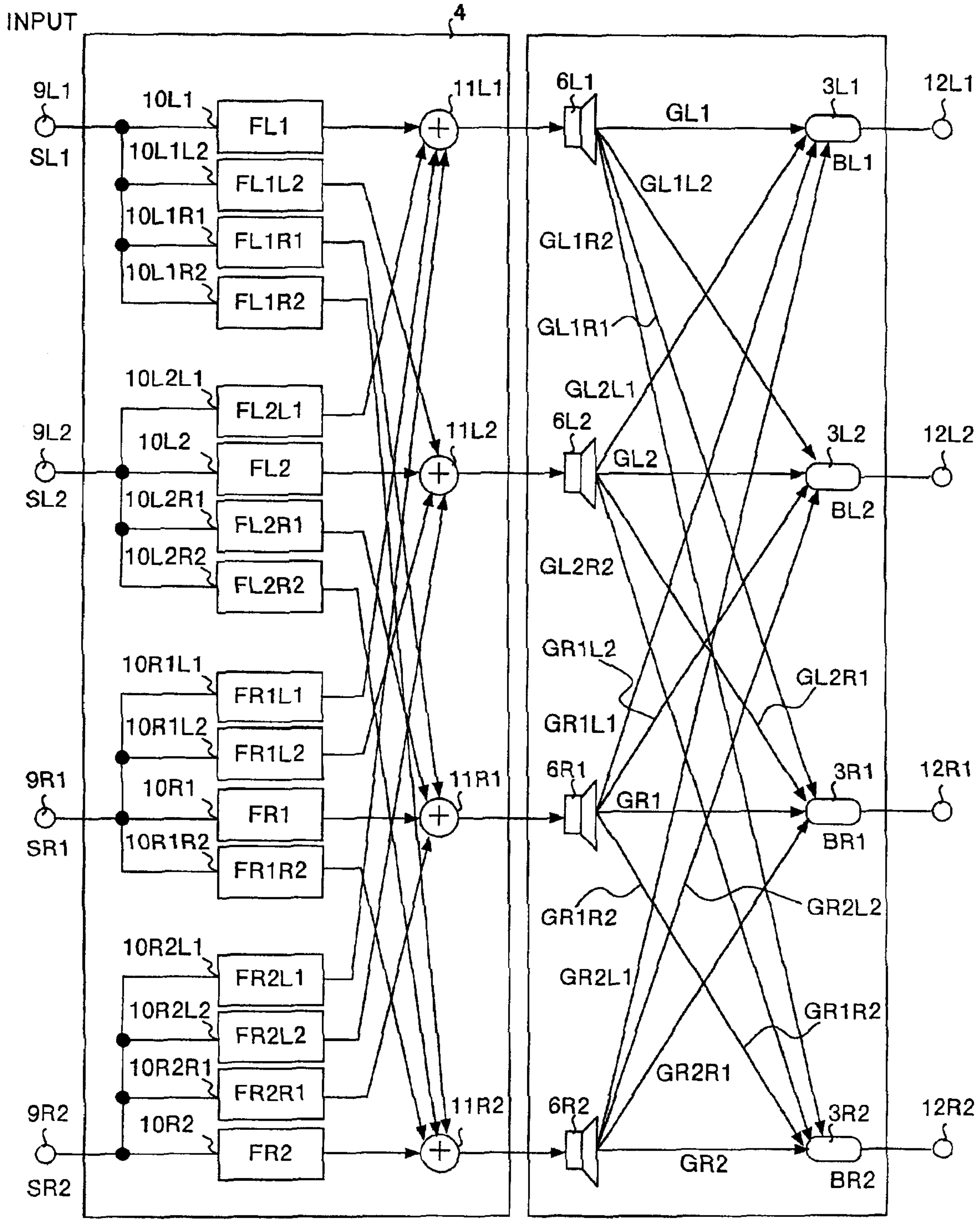
FIG. 8 is an explanatory diagram for explaining a function of the signal processing unit according to the present embodiment.

FIG. 8 is an explanatory diagram for explaining a function of the signal processing unit 4 according to the present embodiment. In order to explain the function of the signal processing unit 4, for example, the minimicrophones 3L1, 3L2, 3R1 and 3R2 are arranged in the positions BL1, BL2, BR1 and BR2. When the signal SL1 is input into the input terminal 9L1, the circuit 10L1 outputs a signal for correcting characteristics from the reproduction-use minispeaker 6L1 via the propagation path of the transmission function GL1 to the minimicrophone 3L1. Moreover, the cross talk cancellers 10L1L2, 10L1R1 and 10L1R2 generate cross talk canceling signals for mainly canceling cross talk components which are output from the reproduction-use minispeaker 6L1 and detected in the minimicrophones 3L2, 3R1 and 3R2.

Similarly, when the signal SL2 is input into the input terminal 9L2, the circuit 10L2 outputs a signal for correcting characteristics from the reproduction-use minispeaker 6L2 via the propagation path of the transmission function GL2 to the minimicrophone 3L2. Moreover, the cross talk cancellers 10L2L1, 10L2R1 and 10L2R2 generate cross talk canceling signals for mainly canceling cross talk components which are output from the reproduction-use minispeaker 6L2 and detected in the minimicrophones 3L1, 3R1 and 3R2.

In addition, when the signal SR1 is input into the input terminal 9R1, the circuit 10R1 outputs a signal for correcting characteristics from the reproduction-use minispeaker 6R1 via the propagation path of the transmission function GR1 to the minimicrophone 3R1. Moreover, the cross talk cancellers 10R1L, 10R1L2 and 10R1R2 generate cross talk canceling signals for mainly canceling cross talk components which are output from the reproduction-use minispeaker 6R1 and detected in the minimicrophones 3L1, 3L2 and 3R2.

In addition, when the signal SR2 is input into the input terminal 9R2, the circuit 10R2 outputs a signal for correcting characteristics from the reproduction-use minispeaker 6R2 via the propagation path of the transmission function GR2 to the minimicrophone 3R2. Moreover, the cross talk cancellers 10R2L1, 10R2L2 and 10R2R1 generate cross talk canceling signals for mainly canceling cross talk components which are output from the reproduction-use minispeaker 6R2 and detected in the minimicrophones 3L1, 3L2 and 3R1.

These correction-use signals are synthesized by the adders 11L1, 11L2, 11R1 and 11R2, and the reproduction-use minispeakers 6L1, 6L2, 6R1 and 6R2 reproduce sound waves for correcting the cross talk components and the direct components. This reproduction is executed simultaneously from the reproduction-use minispeakers 6L1, 6L2, 6R1 and 6R2 so that the same signals as the signals SL1, SL2, SR1 and SR2 input into the input terminals 9L1, 9L2, 9R1 and 9R2 are output from output terminals 12L1, 12L2, 12R1 and 12R2 of the minimicrophones 3L1, 3L2, 3R1 and 3R2. Namely, the sound pressures PAL1, PAL2, PAR1 and PAR2 at the time of recording coincide with the sound pressures PBL1, PBL2, PBR1 and PBR2 at the time of reproduction.

Figure 9:
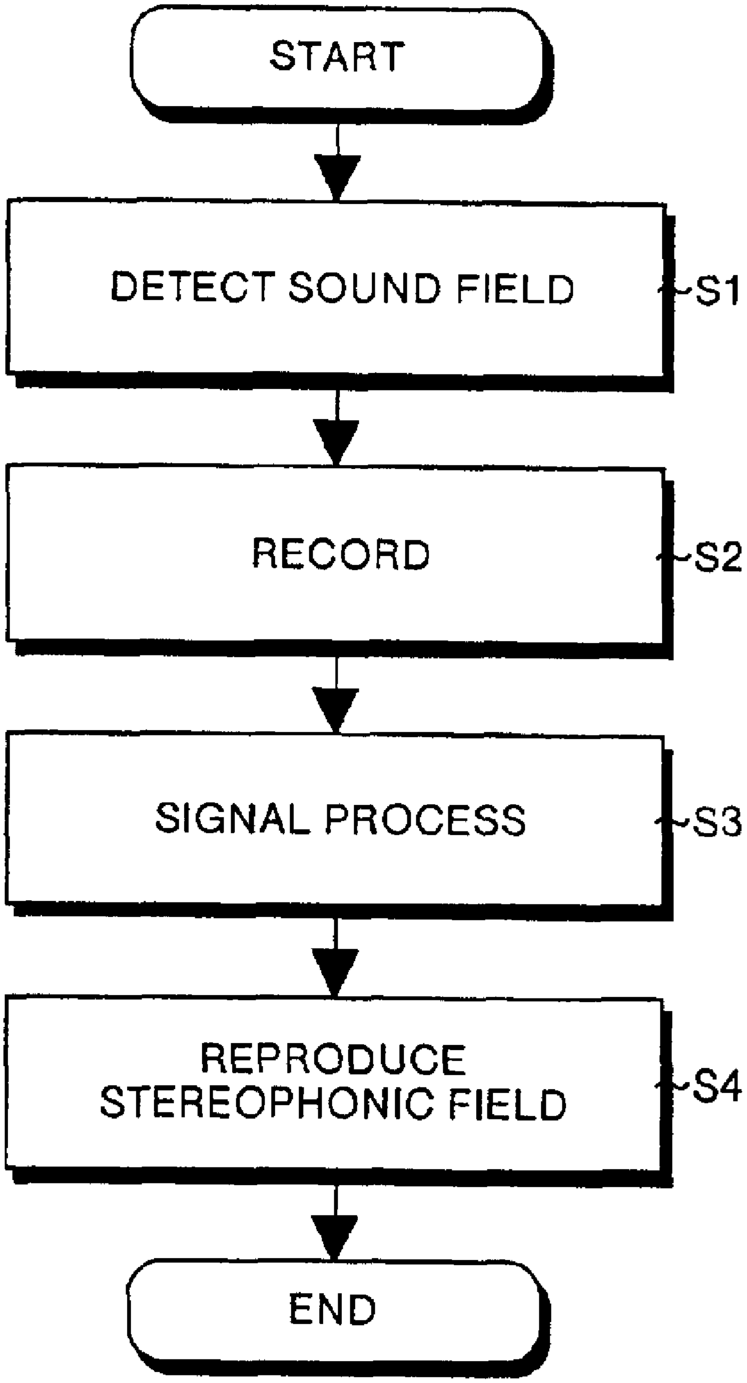
FIG. 9 is a flowchart showing a flow of an operation of the stereophonic sound field reproducing apparatus according to the present embodiment.

How the stereophonic sound field reproducing apparatus according to the present embodiment function will be explained here with reference to a flowchart. FIG. 9 is a flowchart showing a flow of the operation of the stereophonic sound field reproducing apparatus according to the present embodiment. At first a sound field is detected by the minimicrophones 3L1, 3L2, 3R1 and 3R2 arranged around the head of the HATS2 (S1), and detected signals are recorded by the recorder (S2). The recorded signals are processed by the signal processing unit 4 at the time of using so that characteristics between the reproduction-use minispeakers 6L1, 6L2, 6R1 and 6R2 and the head of the user 5 and the characteristics between the reproduction-use minispeakers 6L1, 6L2, 6R1 and 6R2 are corrected simultaneously (S3). The corrected signals are converted into sound waves by the reproduction-use minispeakers 6L1, 6L2, 6R1 and 6R2 so that a stereophonic sound field is reproduced (S4). Here, for explanation, in FIG. 9, steps S1 and S2 are described separately, but actually these steps are executed parallel and simultaneously. Similarly, steps S3 and S4 are also executed simultaneously.

Figure 10:
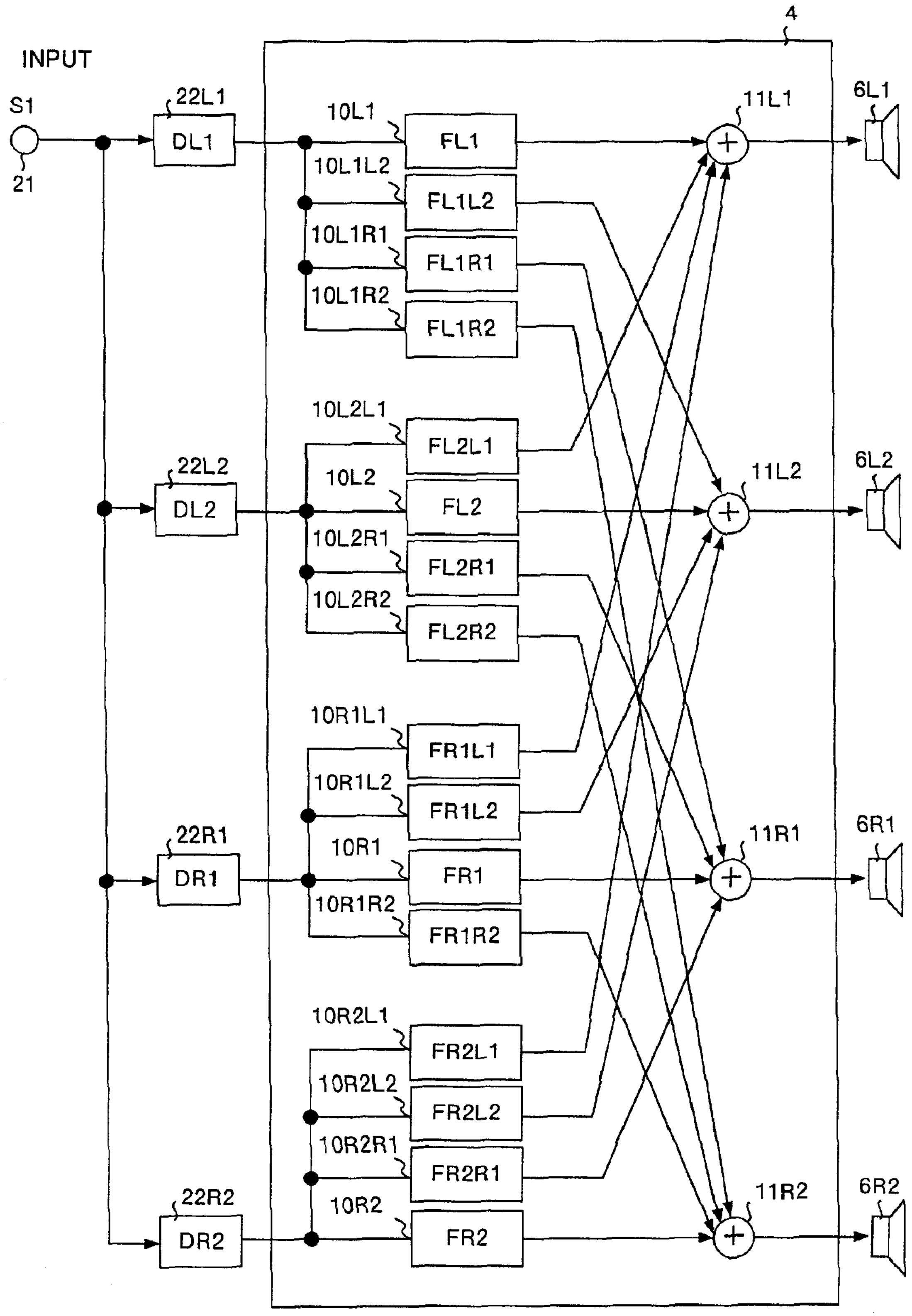
FIG. 10 is a block diagram showing one example of a structure of a head transmission function filter according to the present embodiment.

A head transmission function filter according to the present embodiment will now be explained. A head transmission function filter may be further provided in the stereophonic sound field reproducing apparatus according to the present embodiment. FIG. 10 is a block diagram showing one example of the structure of the head transmission function filter according to the present embodiment. Head portion transmission function filters 22L1, 22L2, 22R1 and 22R2 are arranged at a stage before the signal processing unit 4, and have a common input terminal 21 and output respective output signals to the signal processing unit 4. Namely, signals processed by the head transmission function filters 22L1, 22L2, 22R1 and 22R2 are input into the signal processing unit 4 instead of the signals detected by the minimicrophones 6L1, 6L2, 6R1 and 6R2.

The head transmission function filters 22L1, 22L2, 22R1 and 22R2 may be realized by using, for example, a general-purpose microprocessor or DSP (Digital Signal Processor) for higher speed. Moreover, the signals to the signal processing unit 4 may be digital signals or analog signals.

The head transmission function filter 22L1 convolutes a characteristic, from a sound image fixed position to the position BL1 in the vicinity of ear where the signal is reproduced, on a monophonic signal S1 input from the input terminal 21. Similarly, the head transmission function filter 22L2 convolutes a characteristic, from the sound image fixed position to the position BL2 in the vicinity of the ear where the signal is reproduced, on the monophonic signal S1 input into the input terminal 21. Moreover, the head transmission function filter 22R1 convolutes a characteristic, from the sound image fixed position to the position BR1 in the vicinity of the ear where the signal is reproduce, on the monophonic signal S1 input into the input terminal 21. Further, the head transmission function filter 22R2 convolutes a characteristic, from the sound image fixed position to the position BR2 in the vicinity of the ear where the signal is reproduced, on the monophonic signal S1 input into the input terminal 21.

In other words, when the monophonic signal S1 is input into the input terminal 21, the head transmission function filters 22L1, 22L2, 22R1 and 22R2 execute the convolution process on the input signals S1 for fixing the sound image in predetermined positions, and output the processed signals. When transmission functions DL1, DL2, DR1 and DR2 of the head transmission function filters 22L1, 22L2, 22R1 and 22R2 are approximated to, for example, the head transmission functions HL1, HL2, HR1 and HR2 shown in FIG. 5, the sound image can be fixed in positions where a relationship with the user 5 is the same as the relationship between the position of the head of the HATS2 and the position of the sound source 8.

In the environment shown in FIG. 5, the head transmission functions HL1, HL2, HR1 and HR2 can be calculated in such a manner that the sound source 8 generates white noise and impulse, and the minimicrophones 3L1, 3L2, 3R1 and 3R2 measure the sound pressures PAL1, PAL2, PAR1 and PAR2. These functions can be calculated from the measured results. While the position of the sound source 8 is being changed, the sound pressures PAL1, PAL2, PAR1 and PAR2 are measured so that a plurality of head transmission functions are calculated. Thereafter, the plurality of sets of characteristics (filter factors) of the head transmission function filters 22L1, 22L2, 22R1 and 22R2 are calculated based on the calculated plurality of head transmission functions and may be stored in a memory, not shown. Desired filter factors are selected from the plurality of sets of filter factors stored in the memory and so as to be filter factors of the head transmission function filters 22L1, 22L2, 22R1 and 22R2. As a result, the sound image can be fixed in a desired position.

In this case, the four signals generated by the head transmission function filters 22L1, 22L2, 22Rl and 22R2 have the characteristics which are the same as those of the sound pressures PAL1, PAL2, PAR1 and PAR2. Namely, they have the characteristics which are the same as those of the output signals of the minimicrophones 3L1, 3L2, 3R1 and 3R2. These signals are treated similarly to the signals SL1, SL2, SR1 and SR2 shown in FIG. 8 and undergo the cross talk canceling so that a proper stereophonic sound field can be generated.

Figure 11:
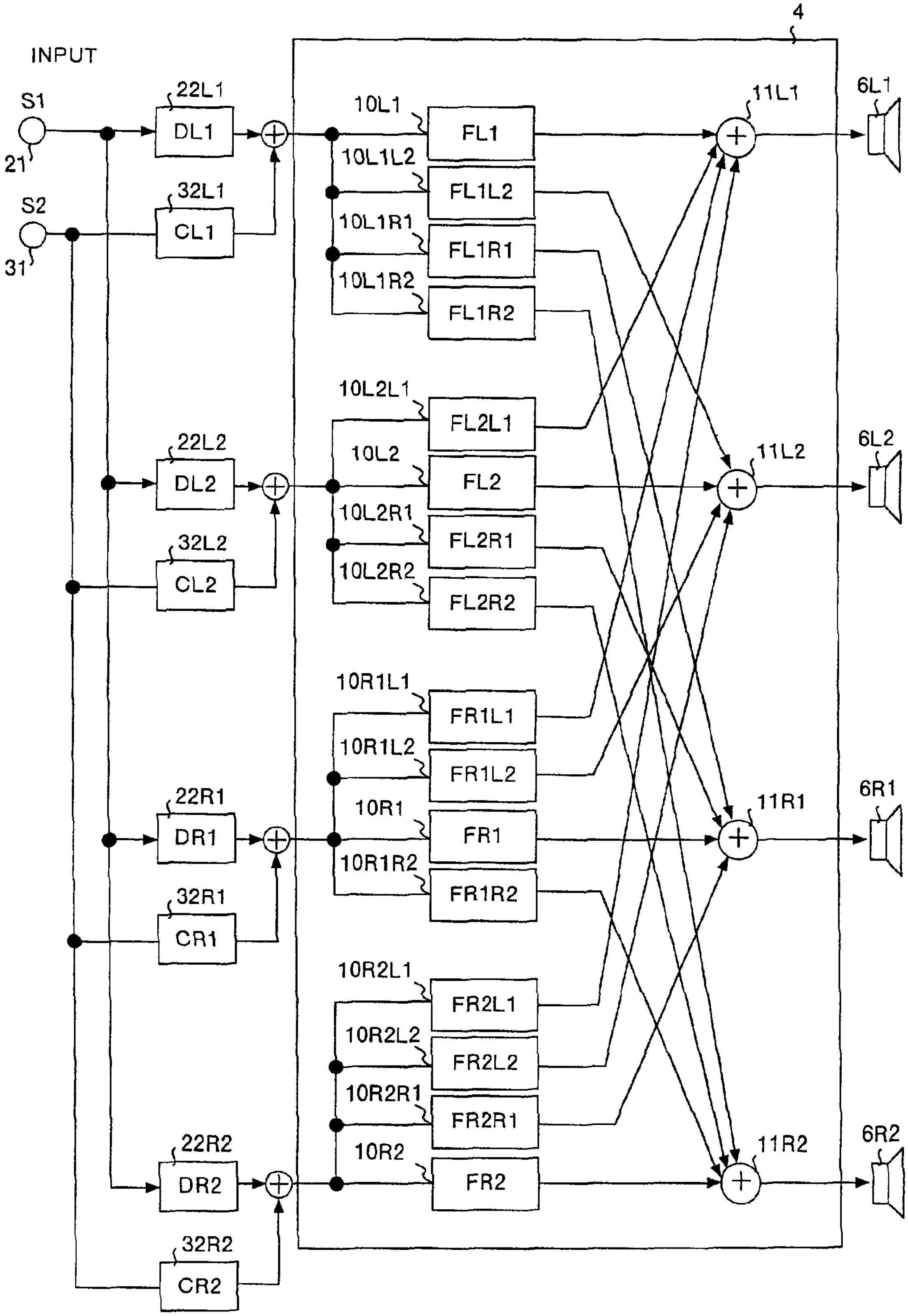
FIG. 11 is a block diagram showing a structure of another head transmission function filter according to the present embodiment.

Further, the plurality of sets of the head transmission function filters may be provided. FIG. 11 is a block diagram showing a structure of another head transmission function filter according to the present embodiment. In this example, head transmission function filters 32L1, 32L2, 32R1 and 32R2 are further provided so as to be the plurality of sets of head transmission filters. The head transmission function filters 32L1, 32L2, 32R1 and 32R2 are arranged at a stage before the signal processing unit 4, and have a common input terminal 31. The output signals of the head transmission function filters 32L1, 32L2, 32R1 and 32R2 are synthesized with the output signals of the head transmission function filters 22L1, 22L2, 22R1 and 22R2 so that the synthesized signals are input into the signal processing section 4.

The head transmission function filter 32L1 convolutes a characteristic, from a sound image fixed position, which is different from the head transmission filters 22L1, 22L2, 22R1 and 22R2, to the position BL1 in the vicinity of ear where the signal is reproduced, on a monophonic signal S2 input from the input terminal 31. Similarly, the head transmission function filter 32L2 convolutes a characteristic, from the sound image fixed position, which is different from the head transmission function filters 22L1, 22L2, 22R1 and 22R2, to the position BL2 in the vicinity of ear where the signal is reproduced, on the monophonic signal S2 input from the input terminal 31. Moreover, the head transmission function filter 32R1 convolutes a characteristic, from a sound image fixed position, which is different from the head transmission function filters 22L1, 22L2, 22R1 and 22R2, to the position BR1 in the vicinity of ear where the signal is reproduced, on the monophonic signal S2 input from the input terminal 31. Further, the head transmission function filter 32R2 convolutes a characteristic, from a sound image fixed position which is different from the head transmission function filters 22L1, 22L2, 22R1 and 22R2, to the position BR2 in the vicinity of ear where the signal is reproduced, on the monophonic signal S2 input from the input terminal 31.

In other words, when the monophonic signal S2 is input into the input terminal 31, the head transmission function filters 32L1, 32L2, 32R1 and 32R2 execute the convolution process on the input signals S2 so that the sound image is fixed in the positions which are independent from the positions where the head transmission function filters 22L1, 22L2, 22R1 and 22R2 fix the sound image so as to output the processed signals. Here, similarly to the head transmission function filters 22L1, 22L2, 22R1 and 22R2, desired filter factors are selected from the plurality of sets of filter factors stored in the memory so as to be filter factors of the head transmission function filters 32L1, 32L2, 32R1 and 32R2. As a result, the sound image can be fixed in desired position.

Figure 12:
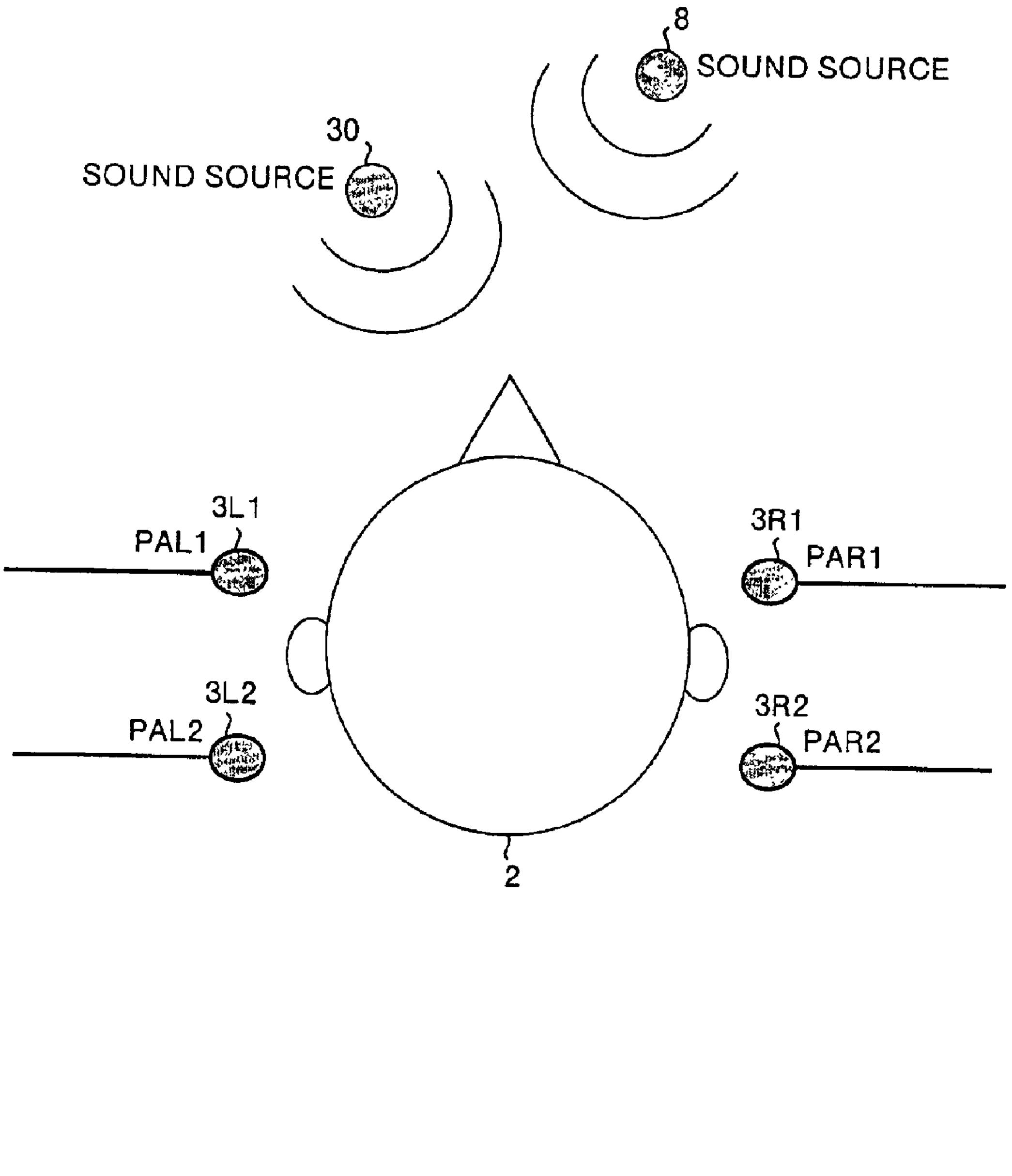
FIG. 12 is an explanatory diagram for explaining the recording process according to the present embodiment in the case where two sound sources exist.

For example, transmission functions CL1, CL2, CR1 and CR2 of the head transmission function filters 32L1, 32L2, 32R1 and 32R2 are approximated to head transmission functions from the sound source 30 shown in FIG. 12 to the minimicrophones 3L1, 3L2, 3R1 and 3R2 so that a stereophonic sound field in the environment shown in FIG. 12 can be reproduced for the user 5. In such a manner, two sets of the head transmission function filters are provided so that the sound image can be fixed in desired two positions simultaneously by using a monophonic sound source. Sets of head transmission function filters are further provided so that the sound image may be fixed in a plurality of positions.

Figure 13:
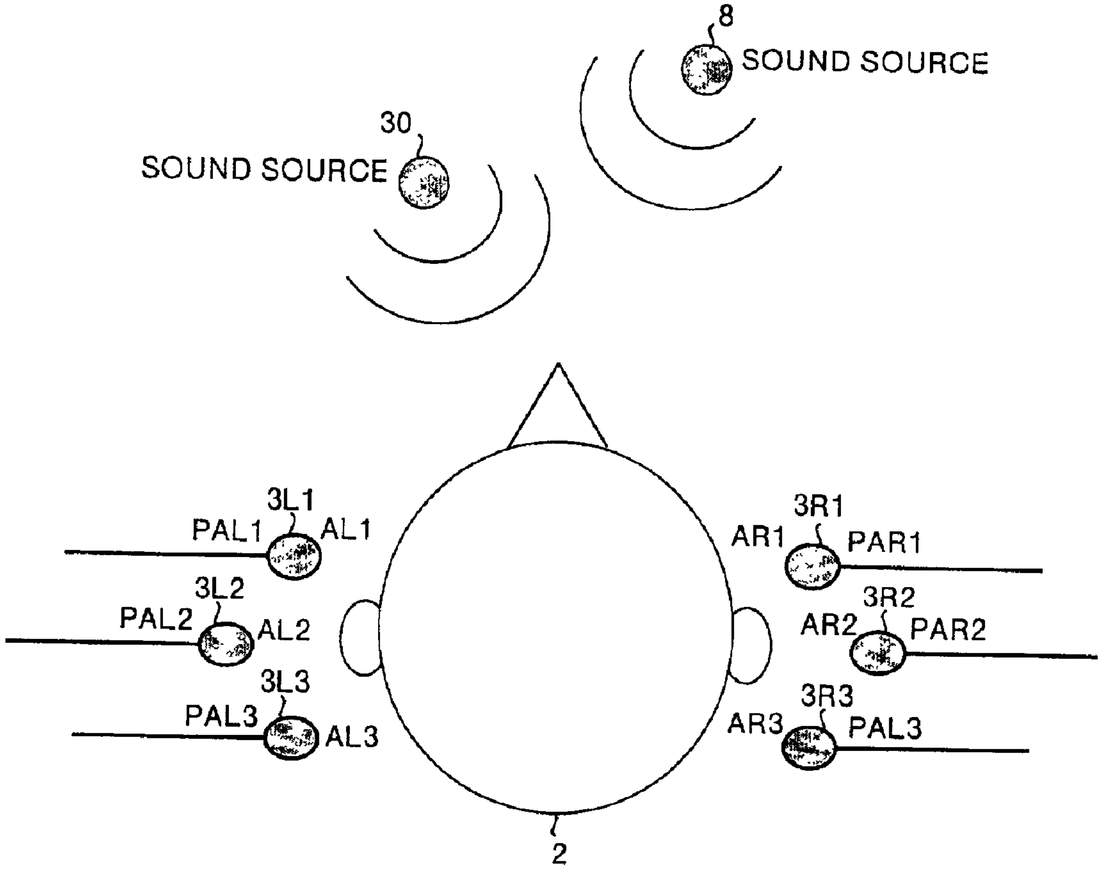
FIG. 13 is an explanatory diagram showing another example of the arrangement of the minimicrophones according to the present embodiment.

In addition, the minimicrophones and the reproduction-use minispeakers are arranged in the vicinities of both the ears of HATS2 and in the vicinities of both the ears of the user 5 so that three or more of them may be provided for each ear. FIG. 13 is an explanatory diagram showing another example of the arrangement of the microphones according to the present embodiment. In this example, minimicrophones 3L3 and 3R3 are further provided in positions AL3 and AR3 in the vicinities of both the ears of HATS2 so a to detect sound pressures PAL3 and PAR3. In this case, two reproduction-use minispeakers are also added, and circuits such as cross talk canceller are added in the signal processing unit 4.

In addition, it is regarded that a cross talk between the right and left reproduction-use minispeakers can be ignored, and the signal processing unit is divided into two for right and left. As a result, the signal process may be executed so as to simultaneously correct characteristics between all reproduction-use minispeakers for one ear and the head of the user 5, characteristics between all the reproduction-use minispeakers for one ear, characteristics between all reproduction-use minispeakers for the other ear and the head of the user 5, and characteristics between all the reproduction-use minispeakers for the other ear.

Figure 14:
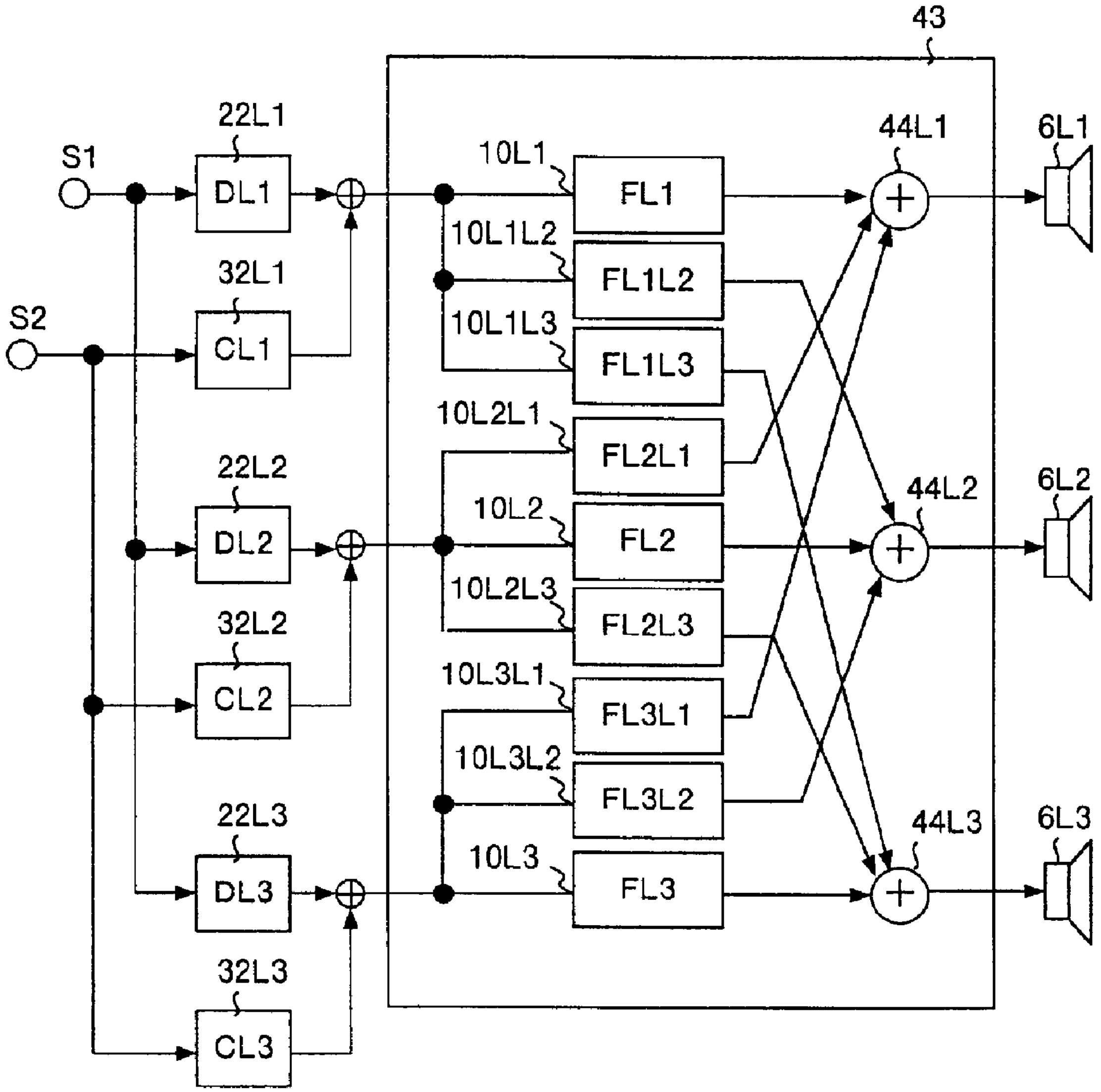
FIG. 14 is a block diagram showing a structure of another signal processing unit according to the present embodiment.

FIG. 14 is a block diagram showing a structure of the signal processing unit (for left) according to the present embodiment. Here, the same reference numerals are given to the same sections as those in FIG. 11, and the description thereof is omitted. This signal processing unit 43 has circuits 10L1 and 10L2, a circuit 10L3, cross talk cancellers FL1L2 and FL1L3, cross talk cancellers FL2L1 and FL2L3, cross talk cancellers FL3L1 and FL3L2, an adder 44L1, an adder 44L2 and an adder 44L3. The circuit 10L3 corrects a direct component which are output from the reproduction-use minispeaker 6L3 arranged in the vicinity of the left ear of the user 5 and is propagated to the vicinity of the left ear. The cross talk cancellers FL1L2 and FL1L3 generate cross talk canceling signals for canceling cross talk components output from the reproduction-use minispeaker 6L1 and propagated to the vicinity of the left ear of the user 5. The cross talk cancellers FL2L1 and FL2L3 generate cross talk canceling signals for canceling a cross talk component output from the reproduction-use minispeaker 6L2 and propagated to the vicinity of the left ear of the user 5. The cross talk cancellers FL3L1 and FL3L2 generate cross talk canceling signal for canceling a cross talk component output from the reproduction-use minispeaker 6L3 and propagated to the vicinity of the left ear of the user 5. The adder 44L1 adds an output signal of the circuit 10L1 and the cross talk canceling signals from the cross talk cancellers 10L2L1 and 10L3L1 so as to output the added signals to the reproduction-use minispeaker 6L1. The adder 44L2 adds an output signal of the circuit 10L2 and the cross talk canceling signals from the cross talk cancellers 10L1L2 and 10L3L2 so as to output the added signals to the reproduction-use minispeaker 6L2. The adder 44L3 adds an output signal of the circuit 10L3 and the cross talk canceling signals from the cross talk cancellers 10L1L3 and 10L2L3 so as to output the added signals to the reproduction-use minispeaker 6L3.

22L3 and 32L3 arranged at a stage before the signal processing unit 43 are head transmission function filters whose transmission functions are DL3 and CL3 respectively. The process is divided independently into two for right and left in such a manner so that the process and the circuits can be simplified. Here, since the right-use signal processing unit has the structure similar to the left-use processing unit 43 and performs the similar operation, the description thereof is omitted.

Figure 15:
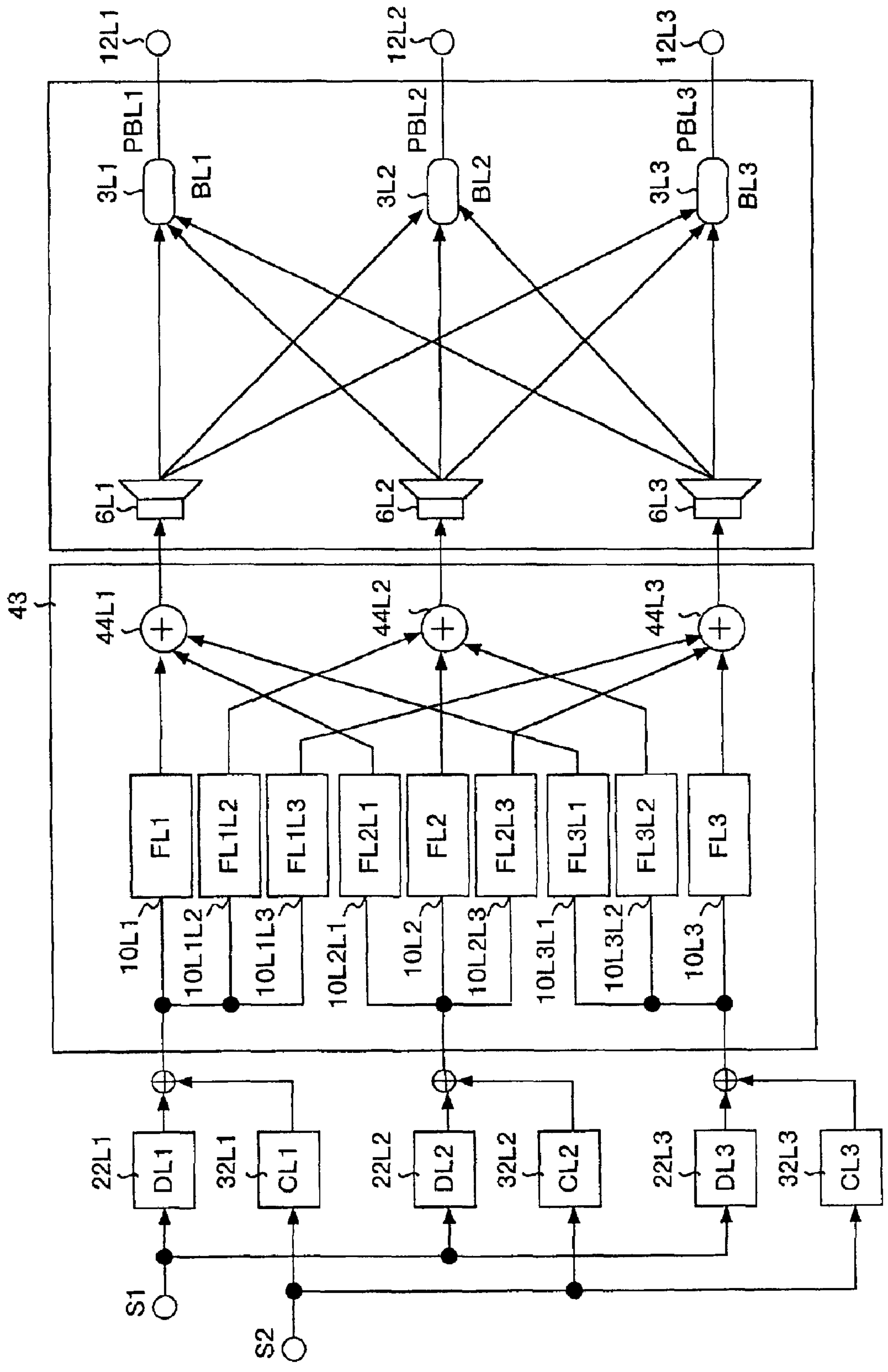
FIG. 15 is an explanatory diagram for explaining a function of another signal processing unit according to the present embodiment.

FIG. 15 is an explanatory diagram for explaining a function of the signal processing unit 43 according to the present embodiment. In order to explain the function of the signal processing unit 43, for example, minimicrophones 3L1, 3L2 and 3L3 are arranged in positions BL1, BL2 and BL3. Here, the position BL3 is relatively equal to the position AL3. When the signals from the head transmission function filters 22L1 and 32L1 are input, the circuit 10L1 outputs a signal for correcting a characteristic from the reproduction-use minispeaker 6L1 to the minimicrophone 3L1. Moreover, the cross talk cancellers 10L1L2 and 10L1L3 generate cross talk canceling signals for mainly canceling a cross talk component output from the reproduction-use minispeaker 6L1 and detected by the minimicrophones 3L2 and 3L3.

Similarly, when the signals from the head transmission function filters 22L2 and 32L2 are input, the circuit 10L2 outputs a signal for correcting a characteristic from the reproduction-use minispeaker 6L2 to the minimicrophone 3L2. Moreover, the cross talk cancellers 10L2L1 and 10L2L3 generate cross talk canceling signals for mainly canceling a cross talk component output from the reproduction-use minispeaker 6L2 and detected by the minimicrophones 3L1 and 3L3.

In addition, when the signals from the head transmission function filters 22L3 and 32L3 are input, the circuit 10L3 outputs a signal for correcting a characteristic from the reproduction-use minispeaker 6L3 to the minimicrophone 3L3. Moreover, the cross talk cancellers 10L3L1 and 10L3L2 generate cross talk canceling signals for mainly canceling a cross talk component output from the reproduction-use minispeaker 6L3 and detected by the minimicrophones 3L1 and 3L3.

These correcting signals are synthesizedby the adders 44L1, 44L2 and 44L3, and the reproduction-use minispeakers 6L1, 6L2 and 6L3 reproduce sound waves for correcting the cross talk components and the direct components. When this reproduction is executed simultaneously from the reproduction-use minispeakers 6L1, 6L2 and 6L3, signals which are the same as the signals input into the signal processing unit 43 are output from output terminals 12L1, 12L2 and 12L3 of the minimicrophones 3L1, 3L2 and 3L3. Namely, the sound pressures PAL1, PAL2 and PAL3 at the time of recording coincide with sound pressures PBL1, PBL2 and PBL3 at the time of reproduction. The right and left signal processing units execute the signal processes for right and left simultaneously so that the signal processing unit can be simplified whereas a suitable stereophonic sound field can be reproduced.

Figure 16:
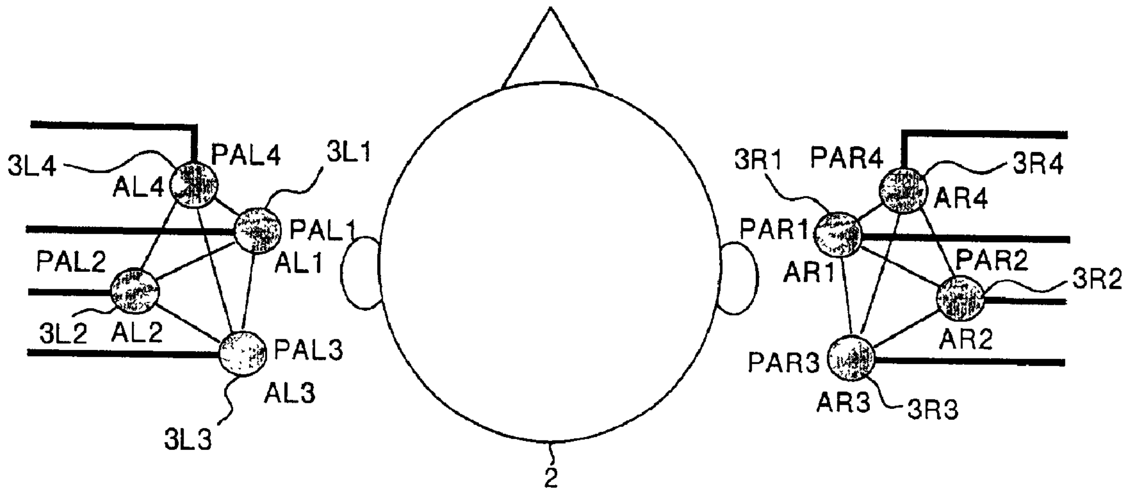
FIG. 16 is an explanatory diagram showing another example of the arrangement of the minimicrophones according to the present embodiment.
Figure 17:
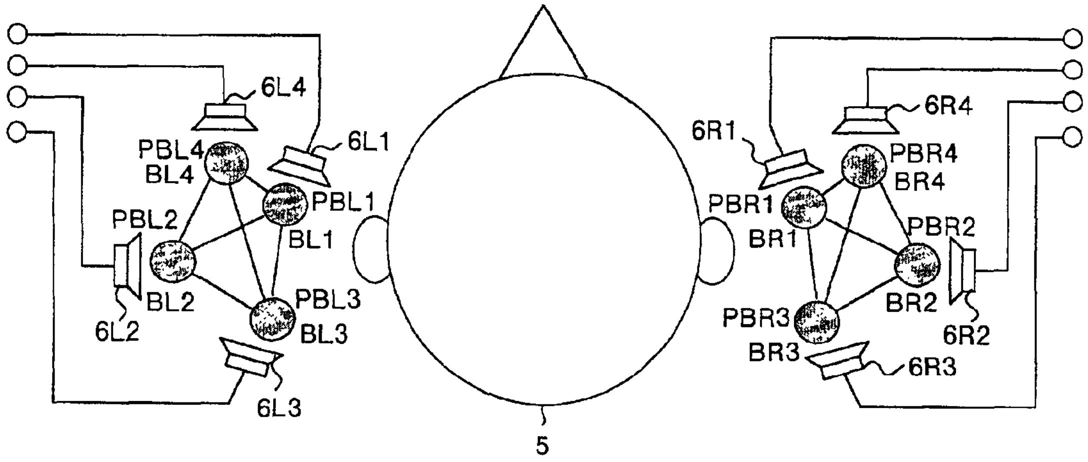
FIG. 17 is an explanatory diagram showing another example of the arrangement of the reproduction-use minispeakers according to the present embodiment.
Figure 18:
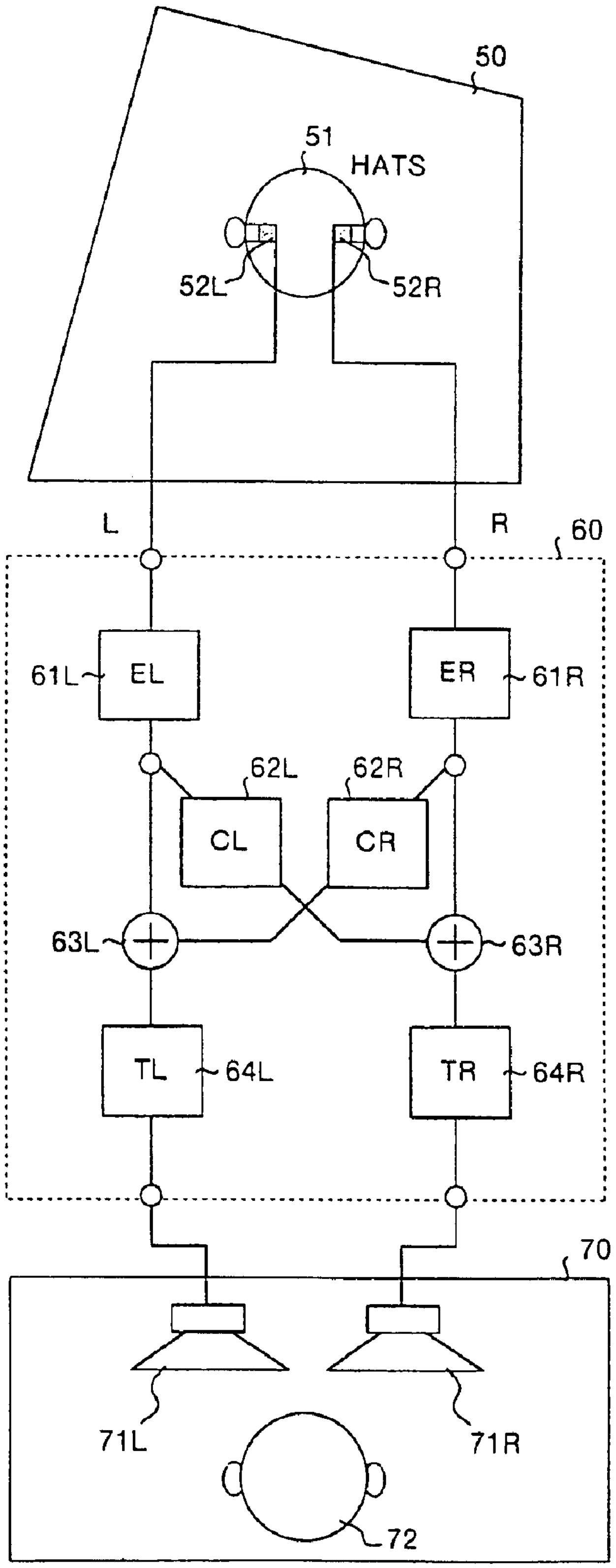
FIG.18 CONVENTIONAL ART
FIG. 18 is an explanatory diagram showing a structure of a conventional OSS.

Further, four or more minimicrophones and reproduction-use speakers may be provided for one ear. FIG. 16 is an explanatory diagram showing another example of an arrangement of the minimicrophones according to the present embodiment. FIG. 17 is an explanatory diagram showing another example of an arrangement of the reproduction-use minispeakers according to the present embodiment. In this example, minimicrophones 3L4 and 3R4 are provided in positions AL4 and AR4 in the vicinities of both the ears of HATS2, and reproduction-use minispeakers 6L4 and 6R4 are provided in vicinities of positions BL4 and BR4 corresponding to the positions AL4 and AR4.

The positions AL1 through AL4 and AR1 through AR4 are positions which become apexes of a triangular pyramid (tetrahedron). Namely, in the case where the positions AL1 through AL4 or AR1 through AR4 are connected by straight lines, a body is formed. Therefore, also the positions BL1 through BL4 and BR1 through BR4 are positions which become apexes of a triangular pyramid (tetrahedron). The positions for three-dimensional recording and reproduction are constituted in such a manner so that more real reproduction of a stereophonic sound field can be expected. The positions for recording and reproduction may be increased.

As explained above, according to the present invention, sound wave output units are arranged around the head of the user at the time of using and input signals to output sound waves, first signal processing unit executes the correcting process on signals to a plurality of sound wave output units so as to simultaneously correct characteristics between the plurality of sound wave output units and the head of the user and characteristics between the plurality of sound wave output units. As a result, even if the user moves his/her head, the positional relationship between the plurality of sound wave output units and the head of the user is not changed. Moreover, since the characteristics between the plurality of sound wave output units and the head of the user and the characteristics between the plurality of sound wave output units are corrected simultaneously, a stereophonic sound field can be reproduced properly.

In addition, since holding unit is attached to the head of the user at the time of using and holds the plurality of sound wave output units to the circumference of the head of the user, the plurality of sound wave output units can be arranged easily around the head of the user.

In addition, since many sound wave output units are arranged in the vicinities the ears of the user in such a manner that at least two sound wave output units are provided for each ear, a stereophonic sound field can be reproduced more properly.

In addition, the plurality of detection units are arranged in positions or their vicinities where a relationship with the head of human body or simulation units which imitates human body is the same as the relationship between the head of the user and the positions of the plurality of sound wave output units. The plurality of detection units detect a sound field and generate signals to be supplied to the sound wave output units. As a result, it is not necessary to calculate a head transmission function, and a stereophonic sound field can be reproduced by using an actually measured value of a sound field around the head. For this reason, a stereophonic sound field can be reproduced more properly.

In addition, second signal processing unit executes the process on signals to be supplied to the sound wave output units using the characteristics from a position where a sound image is fixed to the vicinities of the plurality of sound wave output units. For this reason, a desired sound image can be fixed in a desired position.

In addition, the plurality of sound wave output units are arranged so that the at least four sound wave output units are provided for one ear and arbitrary four sound wave output units for one ear are positioned at apexes of a triangular pyramid. For this reason, a more stereophonic sound field can be reproduced.

In addition, the first signal processing unit executes the signal process for correcting the characteristics between all the plurality of sound wave output units and the head of the user and the characteristics between all the plurality of sound wave output units simultaneously. For this reason, a stereophonic image can be reproduced more properly.

In addition, the plurality of sound wave output units are provided respectively for either of both the ears of the user, and third signal processing unit executes the signal process for correcting characteristics between all the sound wave output units for one ear and the head of the user and characteristics between all the sound wave output units for one ear. Moreover, fourth signal processing unit executes the signal process for correcting characteristics between all the sound wave output units for the other ear and the head of the user and characteristics between all the sound wave output units for the other ear. As a result, since a calculation amount of the signal process is reduced, a hardware for the signal process can be simplified and the cost can be reduced.

Industrial Applicability

As mentioned above, the stereophonic sound field reproducing apparatus of the present invention is suitable for applications to musical sound reproduction, virtual reality and the like.

What is claimed is:

1. A stereophonic sound field reproducing apparatus for reproducing a stereophonic sound field, the apparatus comprising:

- a first sound wave output unit to be positioned in the first vicinity of a first position in the vicinity of a first ear of a user;
- a second sound wave output unit to be positioned in the first vicinity of a second position in the vicinity of the first ear of the user;
- a third sound wave output unit to be positioned in the second vicinity of a third position in the vicinity of a second ear of the user;
- a fourth sound wave output unit to be positioned in the second vicinity of a fourth position in the vicinity of the second ear of the user, wherein each sound wave output unit is configured to receive a signal and to output a sound wave; and
- a first signal processing unit configured to correct
  - a first signal to be supplied to the first sound wave output unit based on a cross-talk component between the second sound wave output unit and the first position,
  - a second signal to be supplied to the second sound wave output unit based on a cross-talk component between the first sound wave output unit and the second position,
  - a third signal to be supplied to the third sound wave output unit based on a cross-talk component between the fourth sound wave output unit and the third position,
  - a fourth signal to be supplied to the fourth sound wave output unit based on a cross-talk component between the third sound wave output unit and the fourth position.

2. The stereophonic sound field reproducing apparatus according to claim 1, further comprising a holding unit, to be attached to a head of the user at the time of using, which holds the sound wave output units at the circumference of the head of the user.

3. The stereophonic sound field reproducing apparatus according to claim 1, further comprising a plurality of detection units, arranged in positions or their vicinities where a relationship with a head of human body or a head of simulation units simulating human body is the same as a relationship between the head of the user and the positions at the time of recording, which detect a sound field and generate signals to be supplied to the sound wave output units.

4. The stereophonic sound field reproducing apparatus according to claim 1, further comprising a second signal processing unit which executes a process on the signals to be supplied to the sound wave output units using characteristics from a position where a sound image is fixed to the positions between the ears of the users and the sound wave output units.

5. The stereophonic sound field reproducing apparatus according to claim 1, further comprising:

- a fifth sound wave output unit to be positioned in the first vicinity of a fifth position in the vicinity of the first ear of the user;
- a sixth sound wave output unit to be positioned in the first vicinity of a sixth position in the vicinity of the first ear of the user;
- a seventh sound wave output unit to be positioned in the second vicinity of a seventh position in the vicinity of the second ear of the user;
- an eighth sound wave output unit to be positioned in the second vicinity of an eighth position in the vicinity of the second ear of the user, wherein
- each sound wave output unit is configured to receive a signal and to output a sound wave, and
- the four sound wave output units provided in the vicinity of each ear are provided in such a manner that they are positioned at apexes of a triangular pyramid.

6. The stereophonic sound field reproducing apparatus according to claim 1, wherein the first signal processing unit corrects characteristics between all of the sound wave output units and the head of the user and characteristics including cross-talk components at a plurality of positions between the ear of the user and the sound wave output units.

7. The stereophonic sound field reproducing apparatus according to claim 1, wherein

- the first signal processing unit includes,
  - a second signal processing unit which corrects characteristics between all the sound wave output units corresponding to the first ear and the head of the user; and
  - a third signal processing unit which corrects characteristics between all the sound wave output units corresponding to the second ear and the head of the user, and
- the second and third signal processing units execute the signal process simultaneously, and
- wherein the characteristics include cross-talk components.

8. The stereophonic sound field reproducing apparatus according to claim 1, wherein each of the plurality of sound wave output units are arranged around each ear of the head of the user based on a position of a plurality of corresponding sound input units.

9. The stereophonic sound field reproducing apparatus according to claim 1, wherein the cross-talk components are created by the sound wave output units.

* * * * *